(12) United States Patent
Yamaguchi et al.

(10) Patent No.: US 8,266,095 B2
(45) Date of Patent: Sep. 11, 2012

(54) SUBSTRATE PROCESSING SYSTEM AND OPERATION INSPECTING METHOD

(75) Inventors: Hideto Yamaguchi, Imizu (JP); Yasuhiro Joho, Nanto (JP); Mitsuhiro Matsuda, Takaoka (JP); Yoshitaka Koyama, Oyabe (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 685 days.

(21) Appl. No.: 12/225,390

(22) PCT Filed: Jun. 18, 2007

(86) PCT No.: PCT/JP2007/062205
§ 371 (c)(1),
(2), (4) Date: Oct. 20, 2008

(87) PCT Pub. No.: WO2007/148640
PCT Pub. Date: Dec. 27, 2007

(65) Prior Publication Data
US 2010/0223277 A1    Sep. 2, 2010

(30) Foreign Application Priority Data

Jun. 19, 2006  (JP) ................................ 2006-169004

(51) Int. Cl.
G06F 15/00 (2006.01)
G06F 15/18 (2006.01)
(52) U.S. Cl. ........................................................ 706/62
(58) Field of Classification Search ................ None
See application file for complete search history.

(56) References Cited

U.S. PATENT DOCUMENTS
2007/0219664 A1*  9/2007  Yasukawa et al. ............ 700/223

FOREIGN PATENT DOCUMENTS

| JP | 10-275842 | 10/1998 |
|---|---|---|
| JP | 2001-143981 | 5/2001 |
| JP | 2002-15969 | 1/2002 |
| JP | 3630245 | 12/2004 |
| JP | 2005-109437 | 4/2005 |
| JP | 2008-91518 | 4/2008 |
| WO | WO 2006/059625 | 6/2006 |

OTHER PUBLICATIONS

ISR and partial English-language translation.
Japanese Office Action dated Apr. 5, 2011, with partial English translation.

* cited by examiner

*Primary Examiner* — Omar Fernandez Rivas
*Assistant Examiner* — Luis Sitiriche
(74) *Attorney, Agent, or Firm* — McGinn IP Law Group, PLLC

(57) ABSTRACT

There is provided a substrate processing system that can automatically inspect the operation of various kinds of parts of a semiconductor manufacturing apparatus without increasing the load of a main controller in the semiconductor manufacturing apparatus. In the substrate processing system of the present invention, inspection data of the semiconductor manufacturing apparatus 1 under operation are shared and collected online by a main controller 5, a data collection auxiliary computer 2 and a data collecting computer 3 through a network 6, and the operation state is collectively inspected by an inspecting computer 4.

9 Claims, 18 Drawing Sheets

PART OF DATA OF WAFER TRANSFER MACHINE A

| (1) | 2005/6/8 12:01:59 | "UNDER CHARGING" |
|---|---|---|
|   |   |   |
| (2) | 2005/6/8 12:02:34 | "ON STANDBY" |
| (3) | 2005/6/8 12:36:05 | "UNDER DISCHARGING" |
|   |   |   |
| (4) | 2005/6/8 12:45:13 | "ON STANDBY" |

2005/6/8 12:02:00

SPECIFIED TIME RANGE

2005/6/8 12:40:00

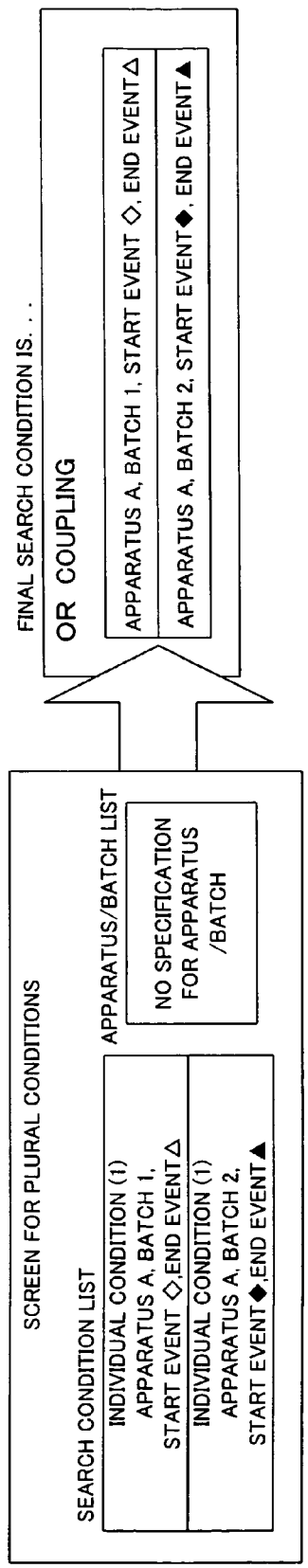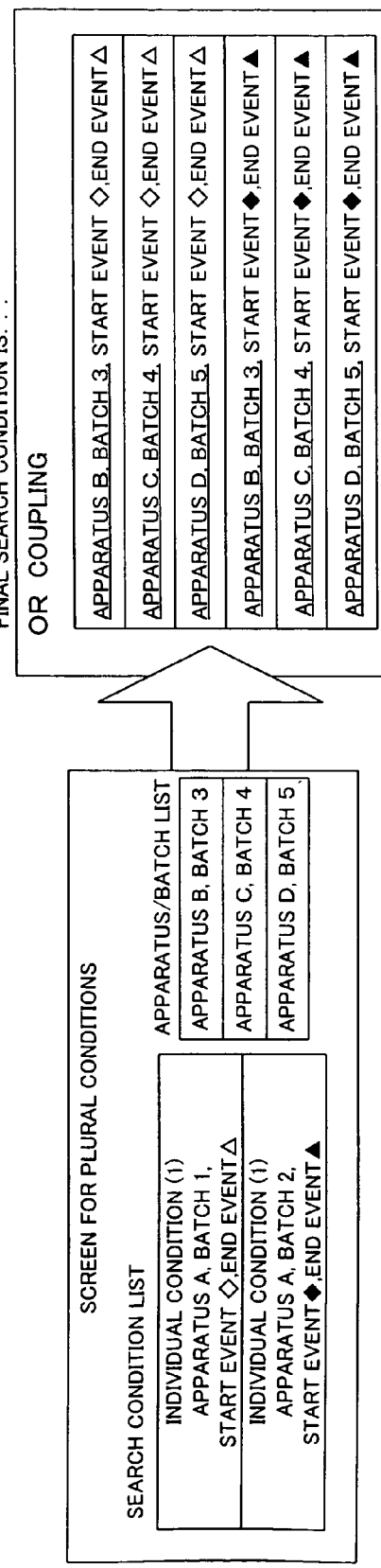

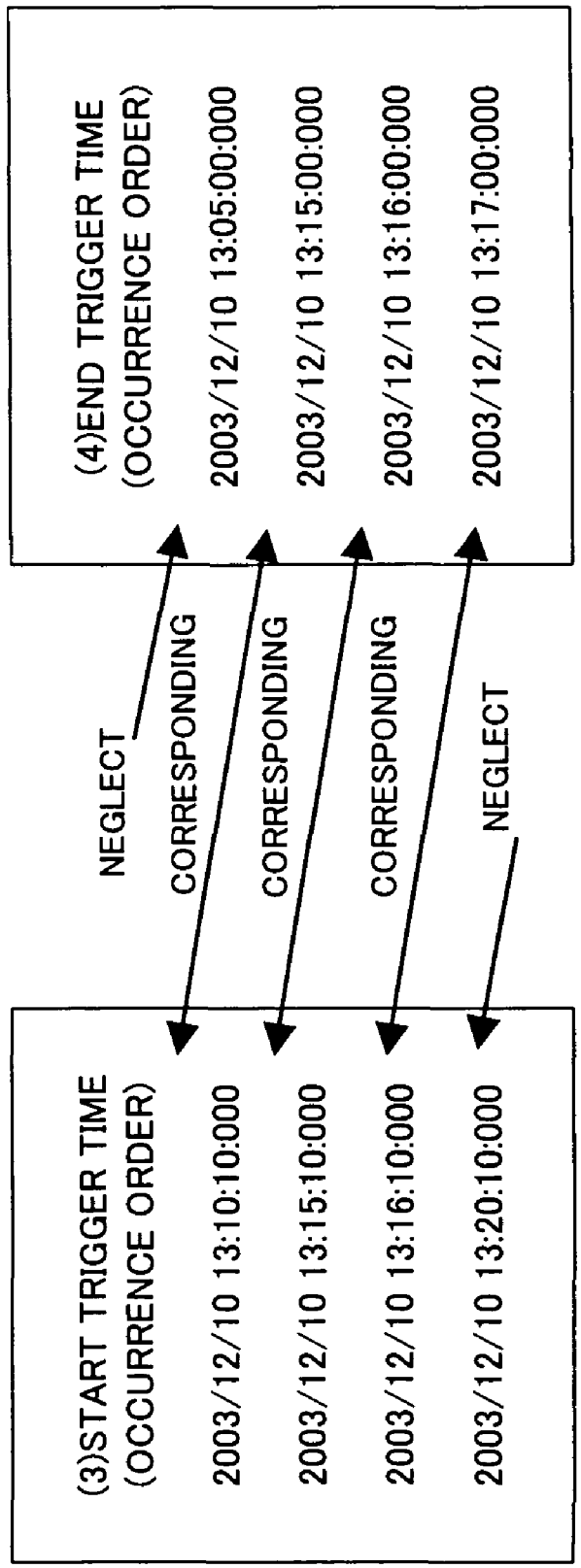

FIG.12

SPECIFIC APPARATUS, SPECIFIC BATCH, SPECIFIC EVENT CONDITION

| CONDITION | CHECK EVENT DATA AND RELEVANT PARAMETER DATA IN SPECIFIC EVENT OF SPECIFIC BATCH OF SPECIFIC APPARATUS |
|---|---|
| SPECIFIED APPARATUS, SPECIFIED BATCH | ONE FOR EACH |
| SPECIFIED EVENT CONDITION | ONE |
| SEARCH PERIOD | ONE, HOWEVER, PLURAL SEARCH PERIODS MAY EXIST IN ACCORDANCE WITH SEARCH RESULT |
| DATA ITEM | EXCEPTIONAL CASE EVENT DATA AND RELEVANT PARAMETER DATA, EVENT DATA AND RELEVANT PARAMETER DATA |

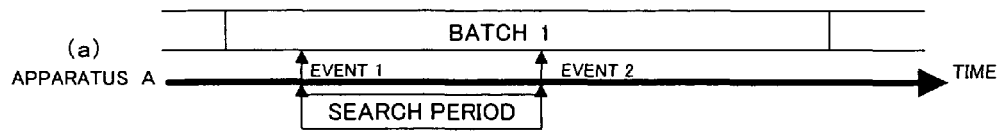

EVENT CONDITION : "SEARCH START IS EVENT 1", "SEARCH END IS EVENT 2"

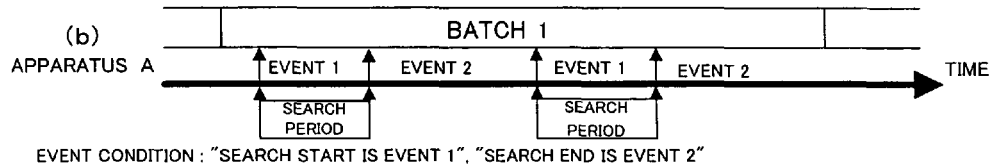

EVENT CONDITION : "SEARCH START IS EVENT 1", "SEARCH END IS EVENT 2"

(IN CASE OF MANY START CONDITIONS)

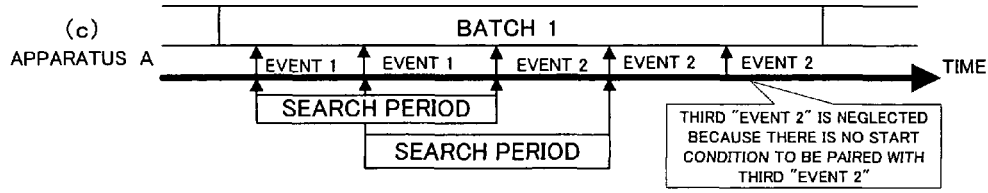

EVENT CONDITION : "SEARCH START IS EVENT 1", "SEARCH END IS EVENT 2"

(IN CASE OF MANY END CONDITIONS)

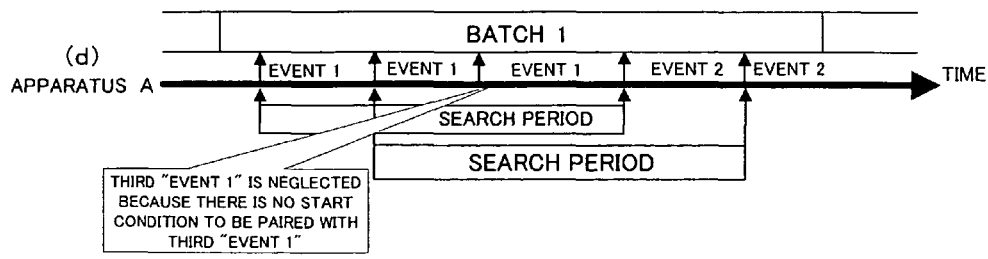

EVENT CONDITION : "SEARCH START IS EVENT 1", "SEARCH END IS EVENT 2"

FIG.13

SPECIFIC APPARATUS, SPECIFIC BATCH, SPECIFIC EVENT CONDITION

| CONDITION | CHECK AND COMPARE EVENT DATA AND RELEVANT PARAMETER DATA IN SPECIFIC EVENT OF SPECIFIC BATCH AMONG APPARATUSES |
|---|---|
| SPECIFIED APPARATUS, SPECIFIED BATCH | PLURAL APPARATUSES, PLURAL BATCHES (ONE FOR EACH APPARATUS) |
| SPECIFIED EVENT CONDITION | ONE |
| SEARCH PERIOD | PLURAL (ONE FOR EACH APPARATUS, HOWEVER, PLURAL APPARATUSES MAY EXIST IN ACCORDANCE WITH SEARCH RESULT) |
| DATA ITEM | EXCEPTIONAL EVENT DATA AND RELEVANT PARAMETER DATA, EVENT DATA AND RELEVANT PARAMETER DATA |

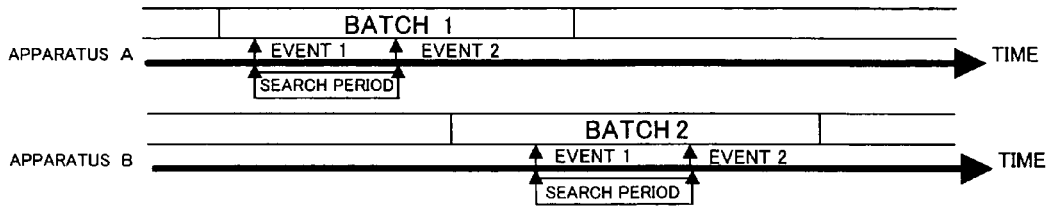

EVENT CONDITION : "SEARCH START IS EVENT 1", "SEARCH END IS EVENT 2"

FIG.14

SPECIFIC APPARATUS, PLURAL BATCHES, SPECIFIC EVENT CONDITION

| CONDITION | CHECK AND COMPARE EVENT DATA AND RELEVANT PARAMETER DATA IN SPECIFIC EVENT AMONG BATCHES OF SPECIFIC APPARATUS |
|---|---|
| SPECIFIED APPARATUS, SPECIFIED BATCH | ONE APPARATUS, PLURAL BATCHES |
| SPECIFIED EVENT CONDITION | ONE |
| SEARCH PERIOD | PLURAL |
| DATA ITEM | EXCEPTIONAL EVENT DATA AND RELEVANT PARAMETER DATA, EVENT DATA AND RELEVANT PARAMETER DATA |

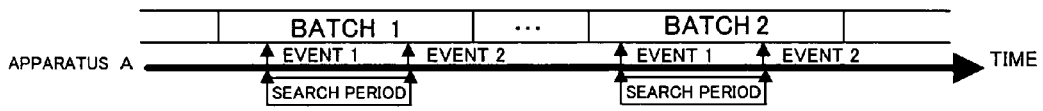

EVENT CONDITION : "SEARCH START IS EVENT 1", "SEARCH END IS EVENT 2"

FIG.15

SPECIFIC APPARATUS, SPECIFIC BATCH, PLURAL EVENT CONDITIONS

| CONDITION | CHECK AND COMPARE EVENT DATA AND RELEVANT PARAMETER DATA AMONG EVENTS OF SPECIFIC BATCH OF SPECIFIC APPARATUS |
|---|---|
| SPECIFIED APPARATUS, SPECIFIED BATCH | ONE FOR EACH |
| SPECIFIED EVENT CONDITION | PLURAL |
| SEARCH PERIOD | PLURAL |
| DATA ITEM | EXCEPTIONAL EVENT DATA AND RELEVANT PARAMETER DATA, EVENT DATA AND RELEVANT PARAMETER DATA |

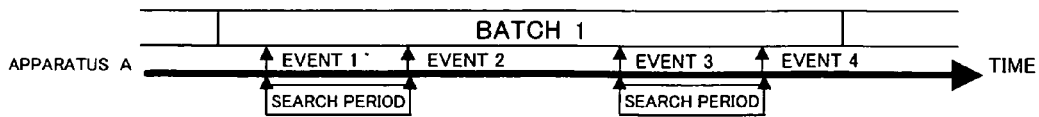

EVENT CONDITION 1 : "SEARCH START IS EVENT 1", "SEARCH END IS EVENT 2"
EVENT CONDITION 2 : "SEARCH START IS EVENT 3", "SEARCH END IS EVENT 4"

FIG.16

SPECIFIC APPARATUS, SPECIFIC BATCH, SPECIFIC EVENT CONDITION

| CONDITION | CHECK PARAMETER DATA, EVENT DATA, EXCEPTIONAL EVENT DATA IN SPECIFIC EVENT OF SPECIFIC TIME OF SPECIFIC APPARATUS |
|---|---|
| SPECIFIED APPARATUS, SPECIFIED BATCH | ONE APPARATUS, NO BATCH SPECIFICATION, TIME SPECIFICATION IN PLACE OF BATCH |
| SPECIFIED EVENT CONDITION | ONE |
| SEARCH PERIOD | ONE, HOWEVER, PLURAL IN ACCORDANCE WITH SEARCH RESULT |
| DATA ITEM | EXCEPTIONAL EVENT DATA AND RELEVANT PARAMETER DATA, EVENT DATA AND RELEVANT PARAMETER |

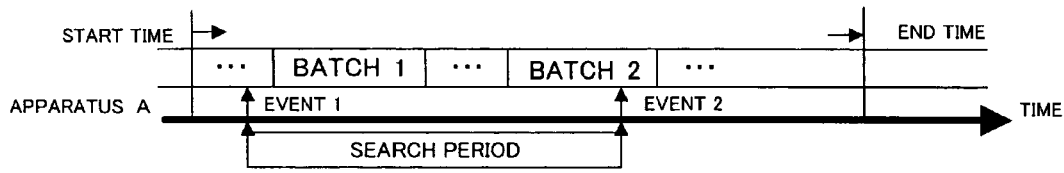

EVENT CONDITION 1: "SEARCH START IS EVENT 1", "SEARCH END IS EVENT 2"

FIG.17

SPECIFIC APPARATUS, SPECIFIC BATCH , PLURAL EVENT CONDITIONS

| CONDITION | CHECK PARAMETER DATA, EVENT DATA AND EXCEPTIONAL EVENT DATA IN PLURAL EVENTS FOR SPECIFIC TIME OF SPECIFIC APPARATUS |
|---|---|
| SPECIFIED APPARATUS, SPECIFIED BATCH | ONE APPARATUS, NO BATCH SPECIFICATION, TIME SPECIFICATION IN PLACE OF BATCH |
| SPECIFIED EVENT CONDITION | PLURAL |
| SEARCH PERIOD | PLURAL |
| DATA ITEM | EXCEPTIONAL EVENT DATA AND RELEVANT PARAMETER DATA, EVENT DATA AND RELEVANT PARAMETER DATA |

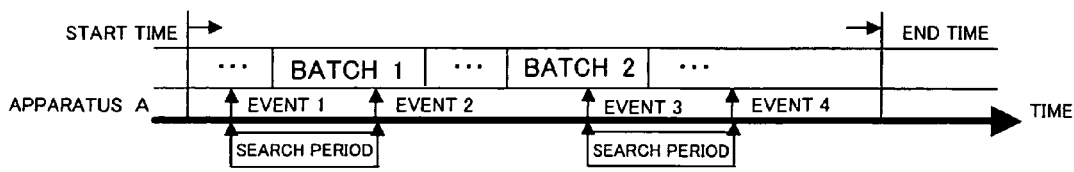

EVENT CONDITION 1: "SEARCH START IS EVENT 1", "SEARCH END IS EVENT 2"
EVENT CONDITION 2 "SEARCH START IS EVENT 3", "SEARCH END IS EVENT 4"

FIG.18

SPECIFIC APPARATUS, FROM SPECIFIC START BATCH
TILL SPECIFIC END BATCH, SPECIFIC EVENT CONDITION

| CONDITION | CHECK PARAMETER DATA, EVENT DATA, EXCEPTIONAL EVENT DATA IN SPECIFIC EVENT OCCURRING IN SEQUENTIAL BATCHES FROM FIRST BATCH TILL LAST BATCH OF SPECIFIC APPARATUS |
|---|---|
| SPECIFIED APPARATUS, SPECIFIED BATCH | ONE APPARATUS, SEQUENTIAL START BATCH AND END BATCH |
| SPECIFIED EVENT CONDITION | ONE |
| SEARCH PERIOD | ONE, HOWEVER, PLURAL SEARCH PERIODS MAY EXIST IN ACCORDANCE WITH SEARCH RESULT |
| DATA ITEM | EXCEPTIONAL EVENT DATA AND RELEVANT PARAMETER DATA, EVENT DATA AND RELEVANT PARAMETER DATA |

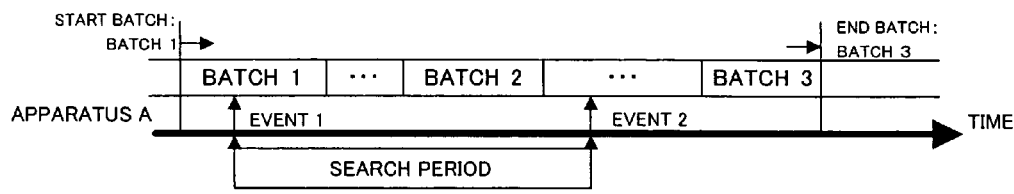

EVENT CONDITION 1 :"SEARCH START IS EVENT 1", "SEARCH END IS EVENT 2"

FIG.19

SPECIFIC APPARATUS, FROM SPECIFIC START BATCH
TILL SPECIFIC END BATCH, PLURAL EVENT CONDITIONS

| CONDITION | CHECK PARAMETER DATA, EVENT DATA, EXCEPTIONAL EVENT DATA IN PLURAL EVENTS OCCURRING IN SEQUENTIAL BATCHES FROM FIRST BATCH TILL LAST BATCH OF SPECIFIC APPARATUS |
|---|---|
| SPECIFIED APPARATUS, SPECIFIED BATCH | ONE APPARATUS, SEQUENTIAL START BATCH AND END BATCH SPECIFIC EVENT CONDITION |
| SPECIFIED EVENT CONDITION | PLURAL |
| SEARCH PERIOD | PLURAL |
| DATA ITEM | EXCEPTIONAL EVENT DATA AND RELEVANT PARAMETER DATA, EVENT DATA AND RELEVANT PARAMETER DATA |

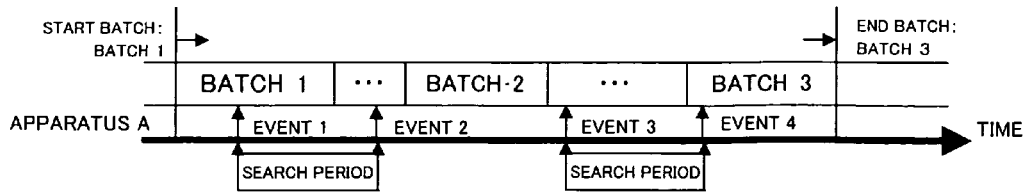

EVENT CONDITION 1 :"SEARCH START IS EVENT 1", "SEARCH END IS EVENT 2"
EVENT CONDITION 2: "SEARCH START IS EVENT 3", "SEARCH END IS EVENT 4"

UPPER LIMIT VALUE

| TIME | VALUE |
|---|---|
| 00:00 | 10.0 |
| — | — |

LOWER LIMIT VALUE

| TIME | VALUE |
|---|---|
| 00:00 | -5.0 |
| — | — |

RELATIVE TIME WHEN HEAD TIME IS SET TO 00:00

UPPER LIMIT VALUE

| TIME | VALUE |
|---|---|
| 00:00 | 10.0 |
| 00:02 | 8.0 |
| 00:04 | 4.0 |
| 00:06 | 2.0 |
| 00:08 | 6.0 |
| : | : |

LOWER LIMIT VALUE

| TIME | VALUE |
|---|---|
| 00:00 | −5.0 |
| 00:06 | −3.0 |
| 00:08 | −1.0 |
| : | : |

SUBSTRATE PROCESSING SYSTEM AND OPERATION INSPECTING METHOD

TECHNICAL FIELD

The present invention relates to a substrate processing system and an operation inspecting method for collecting apparatus data of a semiconductor manufacturing apparatus such as a batch type heat treatment apparatus or the like and detecting a failure on the basis of the collected data.

BACKGROUND ART

In the semiconductor business field, it is a target to be pursued at all times that the yield of semiconductor products is enhanced and the quality level is kept high. Recently, semiconductor manufacturing apparatuses are particularly closed up under the situation that the design quality of semiconductor devices is relatively stable, and it has been strongly required to enhance the quality of semiconductor devices and keep high quality by semiconductor manufacturing apparatuses. Furthermore, for the purpose of optimization of the overall semiconductor manufacturing process, it has been strongly required to enhance the operation rate of the semiconductor manufacturing apparatus such as to shorten the start-up time of the semiconductor manufacturing apparatus and the correspondence time to occurrence of a failure.

Furthermore, the semiconductor manufacturing apparatus is constructed by a large number of parts, and secular distortion is unavoidable in many parts. Therefore, in order to operate the semiconductor manufacturing apparatus with high quality without inducing any failure, it is effective to check visually and periodically whether the parts constituting the semiconductor manufacturing apparatus operates normally or not. However, the visual check is unrealistic in consideration of complexity of the semiconductor manufacturing apparatus and the multitude of the number of parts.

Therefore, in a conventional substrate processing system, there has been adopted a method of converting to an electrical signal an output of a sensor or the like which is required to be periodically checked, taking the electrical signal into the main controller of the semiconductor manufacturing apparatus and comparing it with upper and lower limit values preset in the main controller to thereby judge whether each part normally operates.

DISCLOSURE OF THE INVENTION

Problem to be Solved by the Invention

The number of data pieces which can be taken into the main controller is limited. However, the number of data pieces to be taken to inspect the operation of parts of a semiconductor manufacturing apparatus is very large and it is estimated that the number of data pieces to be taken further increases in the future as the function of the semiconductor manufacturing apparatus is enhanced. Accordingly, in the conventional substrate processing system of the semiconductor manufacturing apparatus, the main controller falls into an overload state, and thus there is a risk that a failure occurs in the main controller.

The present invention has been implemented in view of the problem as described above, and has an object to provide a substrate processing system and an operation inspecting method that can automatically inspect the operation of parts without increasing the load of the main controller of a semiconductor manufacturing apparatus.

Means of solving the Problem

In order to solve the above problem, according to the present invention, a substrate processing system comprising at least one substrate processing apparatus for executing desired processing on a substrate, a data collecting device that collects data from the substrate processing apparatus and has storage unit for storing the collected data, and an inspecting device for inspecting the data accumulated in the storage unit is that the inspecting device comprises search specifying step of searching the data accumulated in the storage unit under a predetermined search condition, upper and lower limit specifying step of specifying an upper limit value and a lower limit value of the data every desired time interval, data obtaining step of obtaining data from the storage unit, and judging step of judging whether the data obtained is within a range specified, wherein the data is data specifying an event and a time for which the event data concerned is continued is inspected.

BRIEF DESCRIPTION OF THE DRAWINGS

FIG. 10 is a detailed diagram showing an effect of a set of plural apparatuses and a batch which are set in the processing of the system of step S50 shown in FIG. 9.

FIG. 11 is a diagram when a start event and an end event of step S33 of FIG. 7 are supported by plural events.

FIG. 12 is a diagram showing a first embodiment of data search in the substrate processing system of the present invention.

FIG. 13 is a diagram showing a second embodiment of data search in the substrate processing system of the present invention.

FIG. 14 is a diagram showing a third embodiment of the data search in the substrate processing system of the present invention.

FIG. 15 is a diagram showing a fourth embodiment of the data search in the substrate processing system of the present invention.

FIG. 16 is a diagram showing a fifth embodiment of the data search in the substrate processing system of the present invention.

FIG. 17 is a diagram showing a sixth embodiment of the data search in the substrate processing system of the present invention.

FIG. 18 is a diagram showing a seventh embodiment of the data search in the substrate processing system of the present invention.

FIG. 19 is a diagram showing an eighth embodiment of the data search in the substrate processing system of the present invention.

BEST MODE FOR CARRYING OUT THE INVENTION

In order to attain the above object, the substrate processing system of the present invention is constructed so as to collect the inspection data of the semiconductor manufacturing apparatus by using the data collecting device, and automatically inspect the operation of the semiconductor manufacturing apparatus on the basis of the data collected by the inspecting device. That is, the substrate processing system is a system for connecting the semiconductor manufacturing apparatus and the data collecting device to each other by a network which can perform high-speed data communication, highly frequently collecting data occurring in the semiconductor manufacturing apparatus under operation online and analyzing the data by the inspecting device while accumulating the data in the storage unit (data base) appending to or connected to the data collecting device.

Next, an embodiment of the substrate processing system according to the present invention will be described in detail with reference to the drawings.

Figure 1:
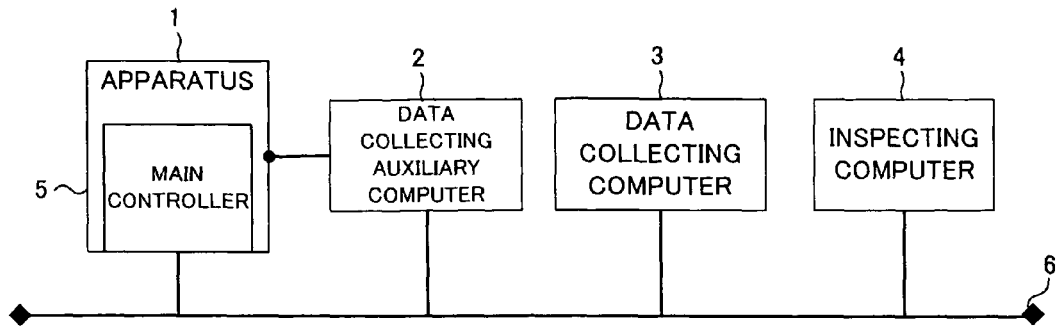
FIG. 1 is a functional block diagram showing the hardware construction of an apparatus data collecting system for implementing a substrate processing system according to the present invention.
Figure 2:
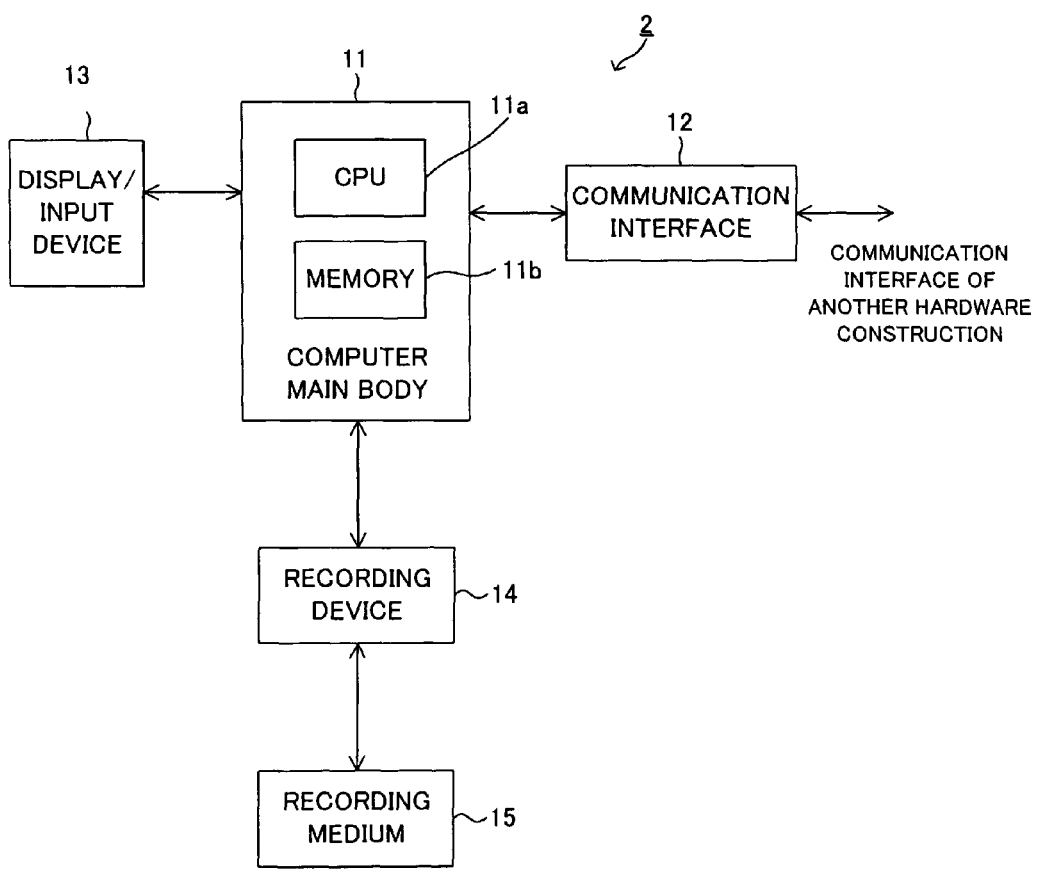
FIG. 2 is a functional block diagram showing the hardware construction of a data collecting auxiliary computer, etc. shown in FIG. 1.

FIG. 1 is a functional block diagram showing the hardware construction of a substrate processing system according to the present invention. FIG. 2 is a functional block diagram showing the hardware construction of a data collecting device shown in FIG. 1.

In FIG. 1, the substrate processing system is equipped with a main controller (main controller) 5, and a semiconductor manufacturing apparatus 1 for collecting various kinds of data, a data collection auxiliary computer (data collecting device) 2, a data collecting computer (data collecting device) 3 and an inspecting computer (inspecting device) 4 are connected to a network 6 which can perform high-speed data communication such as LAN or the like. In the following description, the semiconductor manufacturing apparatus 1 may be referred to as apparatus".

The main controller 5 which is one constituent element of the semiconductor manufacturing apparatus 1 is a controller having a function of obtaining data achieved in the semiconductor manufacturing apparatus 1 under operation, and communicating data with various kinds of computers by a network 6. The data collecting computer 3 has a function of obtaining apparatus data at high speed by communicating with the main controller 5 through the network 6, and a function of accumulating the obtained data into a data base (storage unit) which is provided inside or outside the data collecting computer 3 itself.

The data collecting auxiliary computer 2 is a computer which is provided when the main controller 5 cannot obtain data sufficiently although the data concerned are collected from the semiconductor manufacturing apparatus 1. It obtains data of the semiconductor manufacturing apparatus 1 independently of the main controller 5, and transmits the data to the data collecting computer 3 through the network 6. Accordingly, even when the load of the data collecting processing is large, the processing of the main controller 5 can be beforehand prevented from being obstructed.

The data collected/accumulated by the data collecting computer 3 are searched by the processing of software running on the data collecting computer 3, or by the processing of software running on the inspecting computer 4 connected to the network 6.

The main controller 5 may be designed so as to communicate with neither the data collecting auxiliary computer 2 nor the data collecting computer 3 by collecting all the data through the data collecting auxiliary computer 2 or the data collecting computer 3.

In FIG. 1, only one semiconductor manufacturing apparatus 1 is shown. However, in the substrate processing system of the present invention, a plurality of semiconductor manufacturing apparatuses 1 may be connected, and thus a plurality of semiconductor manufacturing apparatuses 1 and a plurality of data collecting auxiliary computers 2 or data collecting computers 3 may be provided.

Furthermore, as shown in FIG. 2, the data collecting auxiliary computer 2 is constructed by a computer main body 11 containing CPU 11a, a memory 11b, etc., a communication IF (interface) 12, a display/input device 13, a storage device and a recording medium 15. With respect to the data collecting computer 3, the inspecting computer 4 and the main controller 5 shown in FIG. 1, they basically have the same hardware construction as the data collecting auxiliary computer 2 shown in FIG. 2 although they are different from the data collecting auxiliary computer 2 in the scale, the performance, additional devices, etc.

The data to be collected by the data collecting computer 3 or the like are roughly classified into monitor data and event data. The monitor data is data obtained from the sensor with respect to a movable part of the semiconductor manufacturing apparatus 1, and it is mainly given as a numerical value and contains a flow rate value of a mass flow controller, a temperature value of a heater, etc.

For example, in order to increase the temperature from the room temperature to the processing temperature, it is necessary to increase the temperature increasing speed, and thus there are temperature data in a temperature increasing step from the room temperature to the processing temperature, temperature data in the temperature increasing step from the standby temperature to the processing temperature, temperature data of rapid temperature decrease which occurs when a boat is fed into/from a reactor, variation rapid data such as data of pressure which is reduced from the atmosphere pressure when the substrate is processed, etc.

The temperature and the pressure must be kept constant during the substrate processing such as film forming processing of wafer, oxidization/diffusion processing, etc. Therefore, in this case, it is necessary to keep the monitor data to a fixed value, and these data contain data which must be kept to a fixed value as described above.

As described above, variously varying data and fixed data coexist in the monitor data of the semiconductor manufacturing apparatus 1, and both the data of the varying data and the fixed data must be collected. Accordingly, the amount of data to be collected is large, and thus it is necessary to change the upper and lower limit values of data with time lapse.

Next, an event represents a parameter that changes like a table number of parameters used for the transition of the state and the control of the main controller 5, a parameter that indicates time when state in the semiconductor manufacturing apparatus 1 of occurrence/recovery of error etc. changes and event is given as state transition, logic type or the like.

Event data contain data indicating an ON/OFF state of a part such as opening/closing of a valve, data as to whether an error occurs or not, or data as to whether the semiconductor manufacturing apparatus 1 processes the substrate. That is, the semiconductor manufacturing apparatus 1 is managed by collecting event data (data indicating variation of some state) and checking how long some state is continued.

As described above, the collection amount of data is extremely large, and if only the main controller 5 is made to collect data, it would be concerned that an overload is imposed on the main controller 5. Therefore, in the substrate processing system of the present invention, the data collection of the semiconductor manufacturing apparatus 1 is not performed by only the main controller 5, but also it is performed by the data collection auxiliary computer 2 and the data collecting computer 3.

As described above, according to the substrate processing system of the present invention, in order to deal with a case that data must be inspected at a high speed of 10 to 100 Hertz for operation inspection in an element part having a high response speed such as a mass flow controller or the like, a case where it would be sufficient if data is inspected at a low speed of 0.01 Hertz such as supply pressure of cooling water, etc., if the main controller 5 is made to take charge of all of these data, high performance must be required to the main controller. However, each of the data collecting computers 2, 3 carries out data collection and the inspecting computer 4 executes inspection processing, so that it is unnecessary to require high-level performance to the main controller.

Furthermore, in the conventional substrate processing system, the main controller is made to execute all the inspection processing. Therefore, the load of the inspection processing on the main controller is heavy, and thus the processing speed is lowered. Therefore, it may be an obstacle to the apparatus control which is the original task work of the main controller. Furthermore, when the main controller 5 is made to execute all the inspection processing, the high-performance main controller 5 is required, so that the cost price of the apparatus rises up. However, according to the substrate processing system of the present invention, the data collecting auxiliary computer 2, the data collecting computer 3 and the inspecting computer 4 are made to perform data collection and the inspection processing, whereby it is unnecessary to require high performance to the main controller 5, so that the cost of the semiconductor manufacturing apparatus 1 can be lowered.

[Inspecting Program]

Figure 3:
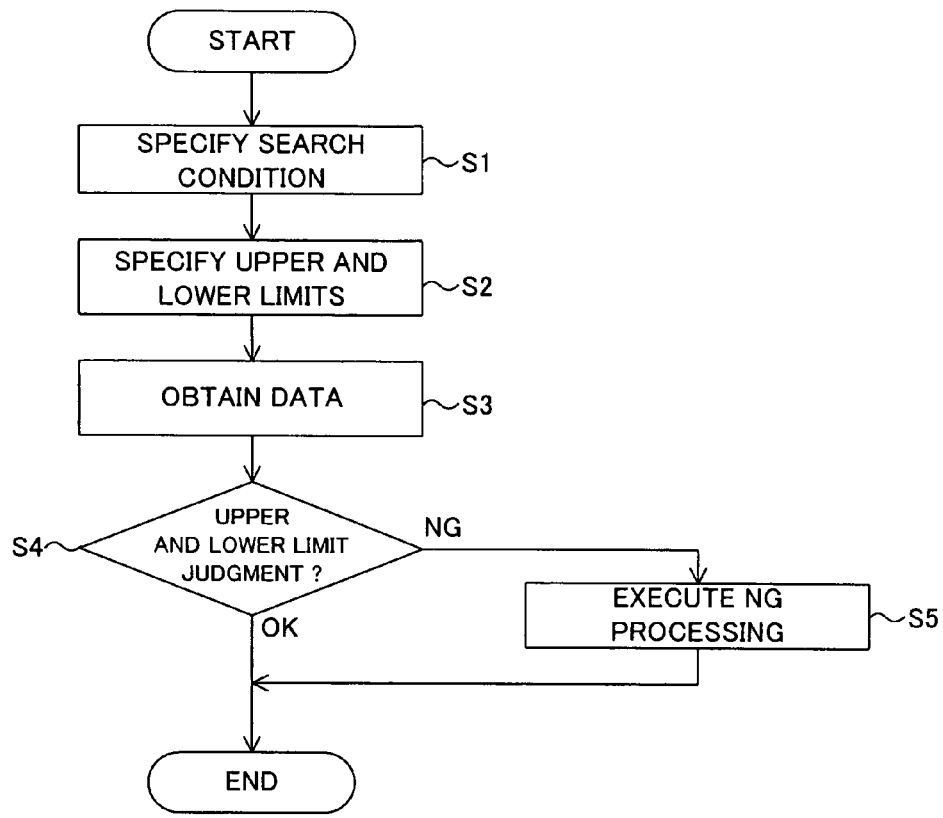
FIG. 3 is a flowchart showing the flow of the processing of a data inspecting program executed by an inspecting computer 4 shown in FIG. 1.

Next, an inspecting program operating in the inspecting computer 4 will be described with reference to FIG. 3. FIG. 3 is a flowchart showing the flow of the processing of the inspecting program executed by the inspecting computer 4 shown in FIG. 1.

First, search condition specification processing of setting an inspection target or recognizing a preset inspecting target is executed (step S1). The inspection target contains at least a time range to be inspected and data information to be inspected. The time range to be inspected directly specifies a time period from 1 p.m. to 3 p.m., for example, or specifies an event that indicates time that the valve becomes a close at time when the valve became an opening until time (that is, the event is a time at which event data is changed to an indicated state, and it is indicated with data information belonging to the event data and the state) or specifies the combination thereof. A plurality of data information pieces may be set. Here, the data information generically designates a data item, a data name, a data number, a data identifier (data ID), etc. Furthermore, the inspection target is called as a search condition, and the search condition will be described later.

Next, when the data to be inspected is constructed by some fragments, upper and lower limit specification processing is executed (step S2) by setting upper and lower limit data for each of the fragments or recognizing preset upper limit and lower limit data. In the setting of the upper and lower limit data, each one fixed value is frequently set for each of the upper limit value and the lower limit value with respect to the time range to be inspected, however, the upper limit value and the lower limit value may be variably set with time lapse as described below in order to deal with a case where data to be inspected varies with time lapse, for example the time when power is turned on or the set value varies.

After 0 minute and 0 second, lower limit: −10, upper limit: +10

After 1 minute and 30 seconds, lower limit: −5, upper limit: +5

After 3 minutes and 10 seconds, lower limit: −0.01, upper limit: +0.5

In the above example, the first line (0 minute and 0 second) represents the relative time from the head of the time range to be inspected.

In the above example, the upper and lower limits are broadened at the instantaneous time when the power is turned on, and the upper and lower limits when the set value (target value) varies are set to be gradually narrower. (Conversely, there is a case where they are set to be first narrow and gradually broadened).

Figures 22A, 22B:
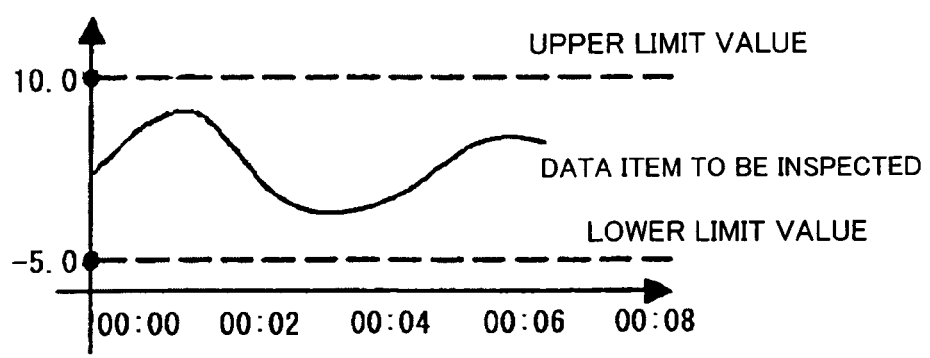
FIG. 22 (a) is a table showing an example when upper and lower limit values of a data item is fixed. (b) is a diagram obtained by graphing the table of (a).
Figures 23A, 23B:
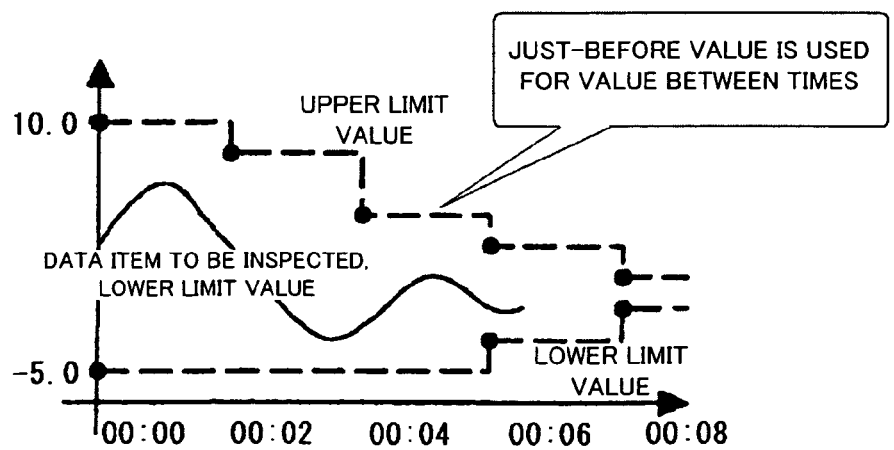
FIG. 23 (a) is a graph showing an example when the upper and lower limit values of the data item vary. (b) is a diagram obtained by graphing the table of (a).

A series for inspecting the upper and lower limits of one data item as described above is called as an upper and lower limit value series, and a pair of upper limit value series and a pair of lower limit value series work for one data item. The upper and lower limit value series is specified as a series of a pair of a relative time series and an absolute time series in order to support both the fixed value and the variable value. The setting of the upper and lower limit value series adopts such a format that if no new line is added at a subsequent time, the data is held. Therefore, when the upper and lower limit values are fixed values, one line is merely set, that is, the upper and lower limit values are merely set at the head time, and they are as shown in FIGS. 22(a) and (b), for example. Furthermore, when the upper and lower limit values vary with time lapse, they are as shown in FIGS. 23(a) and (b), for example.

Next, the data obtaining processing is executed (step S3) by obtaining data as an inspection target from the data base of the data collecting computer 3 according to the search condition.

Next, the upper and lower limit values of the data specified in step S2 and the data obtained in step S3 are compared with each other to judge whether the obtained data is within the range of the upper and lower limit values (step S4). Here, when the time range to be inspected by the event data is specified, the obtained data may be constructed by plural data. However, in this case, the judgment of the upper and lower limit values is executed each data.

When the obtained data exceeds the upper and lower limit values, it is set as NG, and when the obtained data does not exceed the upper and lower limit values, it is set as OK. In the case of NG, the frequency of NG, the time at which each data is set as NG, the obtained data value and the upper and lower limit values are obtained, and the NG processing of step S5 is executed.

That is, in the execution of the NG processing of step S5, arbitrary program is executed in a command line base when NG is set in step S4. For example, an Internet mail indicating NG can be transmitted to a preset specific address. Furthermore, specified data can be recorded in a preset specific storage area. Or, information indicating NG can be displayed on the screen of the inspecting computer 4. One inspecting processing is finished as described above.

The processing of the inspecting program shown in FIG. 3 can be immediately executed by an operator's operation, or executed at an specified time by using a timer in the computer. Or, it may be periodically executed. Here, the periodical execution means the execution processing which is executed once at a predetermined time interval, for example, at 9 a.m. every Monday in a week, or executed at 0 minute every hour.

[Event Start Program]

Next, the event start program will be described. There are data to be always inspected though the wafer is processed by the semiconductor manufacturing apparatus 1 or the semiconductor manufacturing apparatus 1 is idling. The data is, for example, supply pressure etc. of cooling water. However, there are data which are sufficient to be inspected only during the processing of wafer by the semiconductor manufacturing apparatus 1. In the case of data like the latter data, it is necessary to run the inspecting program immediately after the processing of wafer is finished.

However, the processing of wafer by the semiconductor manufacturing apparatus 1 is not necessarily started at a fixed time, but it is normal that it is started at any time day and night. Therefore, it is frequently unknown beforehand what time the processing of wafer is finished at. Therefore, by adding an event start program described below, the inspecting program can be immediately run even when the processing of wafer is irregularly executed.

Figure 4:
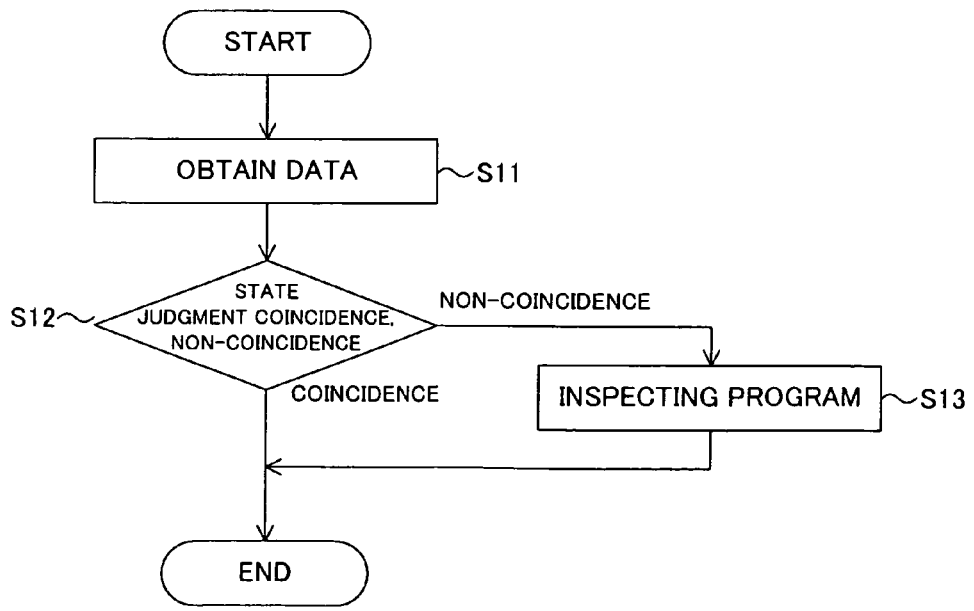
FIG. 4 is a flowchart showing the flow of the processing of starting an event which is executed by an event start program in the apparatus data collecting system shown in FIG. 1.

The flow of the processing of the event start program which is run by the inspecting computer 4 will be described with reference to FIG. 4.

First, with respect to predetermined necessary event data, data that exists in time that went back to the past only during fixed time that has been being set beforehand since present time is obtained from the data base of the data collecting computer 3, thereby data obtaining processing (step S11) is executed.

Subsequently, state judgment processing is executed (step S12) by analyzing the event data obtained in step S11 and judging whether it is a predetermined state. For example, in the example of the processing of wafer as described above, a state that the processing of wafer by the semiconductor manufacturing apparatus 1 is finished is set. A state that the alarm of the semiconductor manufacturing apparatus 1 is recovered, a state that charging of a wafer is finished or the like may be set. In step S12, if the obtained event data is a predetermined "state", that is, in the case of "coincidence", the program is finished. If the obtained event data is not a predetermined state, that is, in the case of "non-coincidence", the processing of step S13 is executed. The step S13 is the inspecting program described above.

The processing of event start aims to monitor the variation of the state of the semiconductor manufacturing apparatus 1, and thus the inspection can be periodically executed in a short time by using a timer in the computer. The periodical inspection is included to execute the inspection once per minute or execute the inspection every five seconds.

[Duration Inspecting Program]

Next, the duration inspecting program will be described. The processing of the inspecting program described with reference to FIG. 3 is mainly the inspection concerning the monitor data. However, there is a case where necessary monitor data cannot be obtained because a sensor is expensive and thus unavailable or there is no sensing technique. Furthermore, even when monitor data are obtained, it may be cumbersome to set upper and lower limit values of detailed data.

For example, in the case of a wafer transfer machine operating in the apparatus, some motors are installed in the wafer transfer machine, and torque values, speeds, etc. can be obtained as the monitor data of these motors. However, it is very troublesome to set the upper and lower limit values for all the monitor data. In such a case, a method of inspecting the time which is required to load wafer (that is, the time period from the wafer charging start time till the wafer charging end time) is suitable. Therefore, it is more effective to provide a duration inspecting program described below together with the inspecting program described above.

Figure 5:
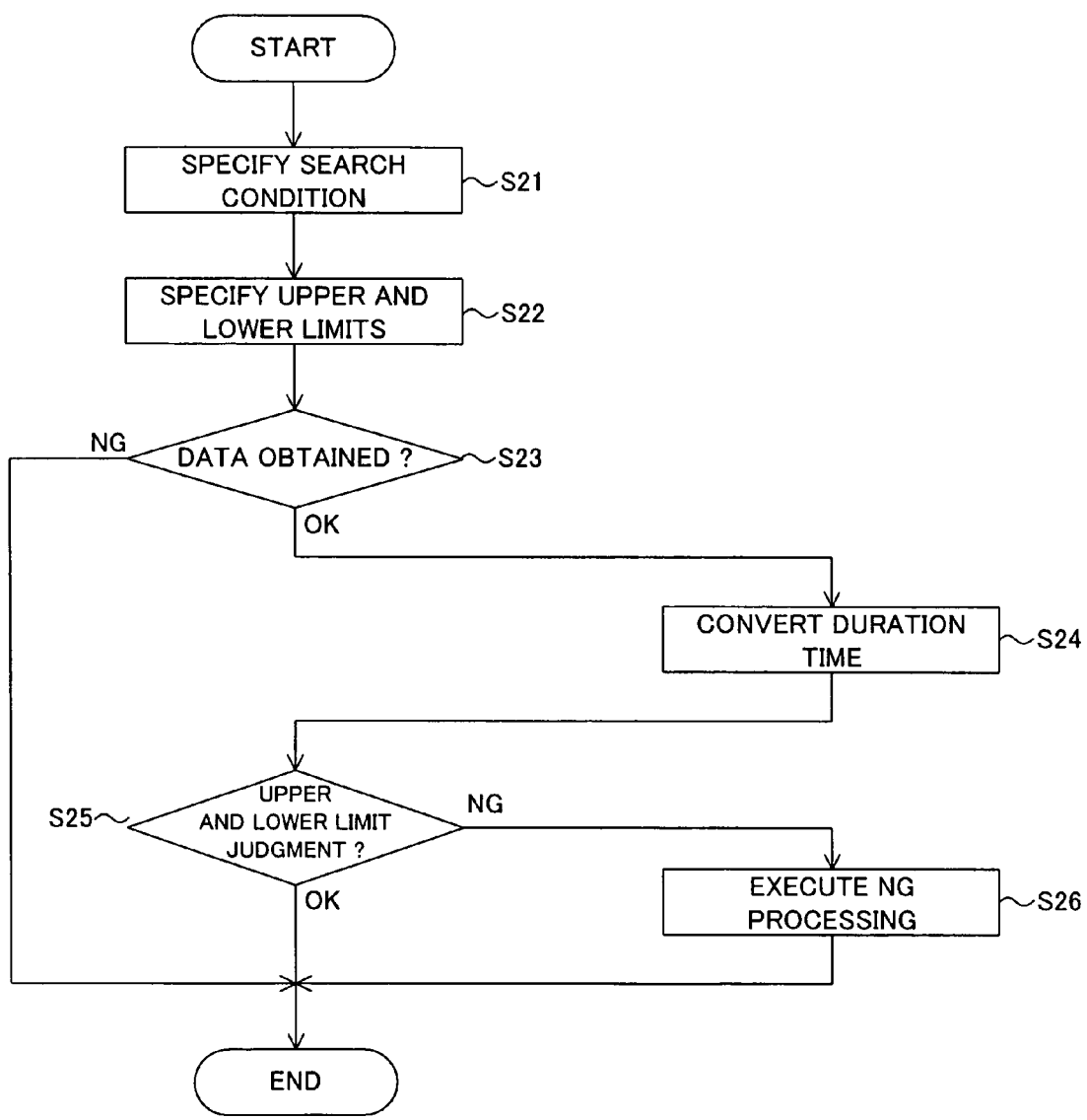
FIG. 5 is a flowchart showing the flow of the processing of a duration inspecting program in the apparatus data collecting system shown in FIG. 1.

FIG. 5 is a flowchart showing the flow of the processing of the duration inspecting program, and the duration inspecting program run by the inspecting computer 4 will be described with reference to FIG. 5.

First, the search condition specification processing is executed (step S21) by setting an inspection target or recognizing a preset inspection target. This step S21 is substantially the same as the search condition specification processing in the inspecting program described with respect to the step S1 of FIG. 3, however, it is different from the inspecting program of FIG. 3 in that the data to be set belongs to event data and further such "state" as the wafer transfer machine being under "charging", the valve being "opened" and alarm "occurring" must be indicated.

Figure 24:
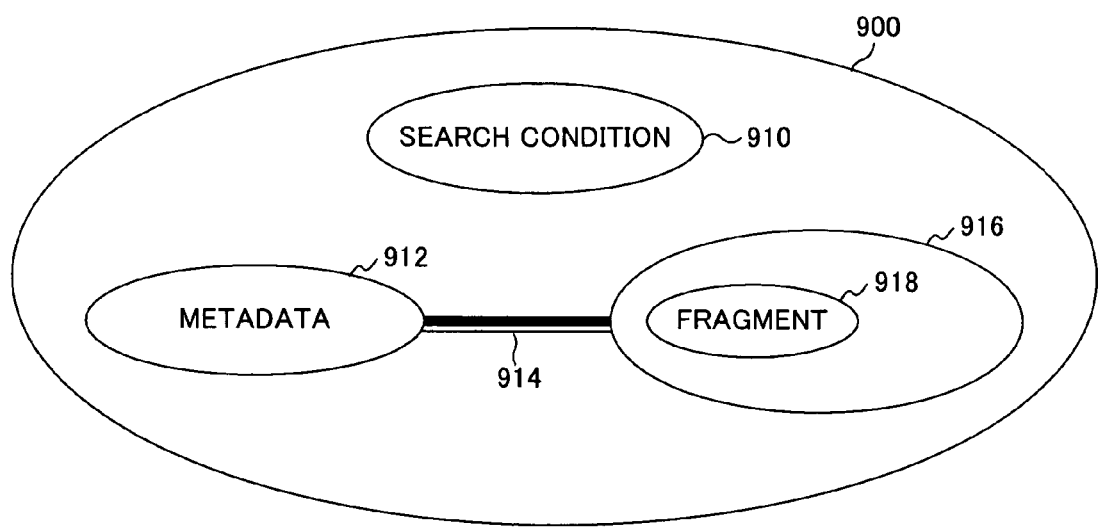
FIG. 24 is a conceptual diagram showing the construction of a search result.
Figure 25:
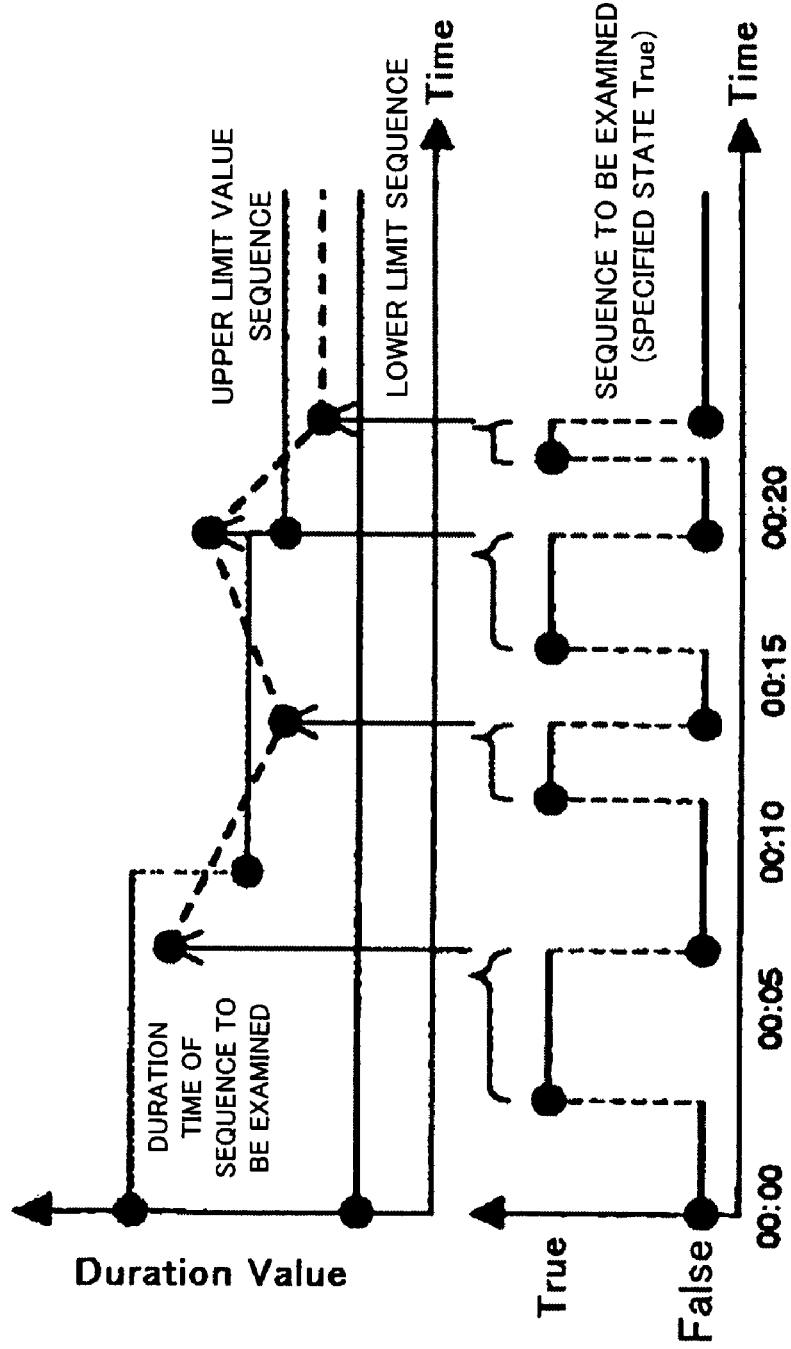
FIG. 25 is a time chart showing the operation of an embodiment.

Next, the upper and lower limit specification processing is executed (step S22) by setting upper limit and lower limit data for each of the data to be inspected or recognizing preset upper and lower limit data. At this time, the setting of the data of the upper and lower limit values is performed with the time. As described above, the upper and lower limit values may be set as fixed values in accordance with the characteristic of the target data to be obtained, or may be set to vary with time lapse. For example, it is as shown in FIG. 24. In FIG. 25, the time for which the state indicated by the data item to be inspected is continued is calculated, and the time and the upper and lower limit values are compared with each other. The comparison between the duration time and the upper and lower limit values is executed at the time at which the continuation of the specified state is finished. When there is no upper and lower limit value series data at the same time as the time when the continuation is finished, the latest upper and lower limit value data before that time are used.

Subsequently, the data obtaining processing is executed (step S23) by obtaining desired data form the data base of the data collecting computer 3 according to the search condition.

Here, a method of obtaining the desired data from the data base will be described with reference to FIG. 6. FIG. 6 is a diagram showing the method of obtaining data for inspecting the duration time in the processing of the duration time inspecting program of FIG. 5.

Figure 6A:
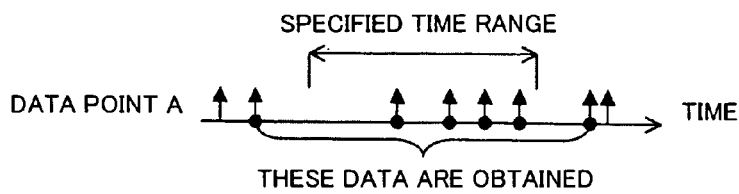
FIG. 6 is a diagram showing a method of obtaining data for inspecting the duration in the processing of the duration inspecting program of FIG. 5.

First, as shown in FIG. 6(a), data of four points occur in the specified time range, however, the data to be obtained are obtained while containing respective one points at both the outsides (or one outside) of the time range. Accordingly, in the case of both the outsides, data of six points are obtained, and in the case of one outside, data of five points are obtained.

Accordingly, even if the head data out of the data belonging to the specified time range is the data at the end time of the specified state, the duration time of the state concerned can be calculated. Likewise, even if the last data out of the data belonging to the specified time range is the data at the start time of the specified state, the duration time of the state concerned can be calculated.

Figure 6B:
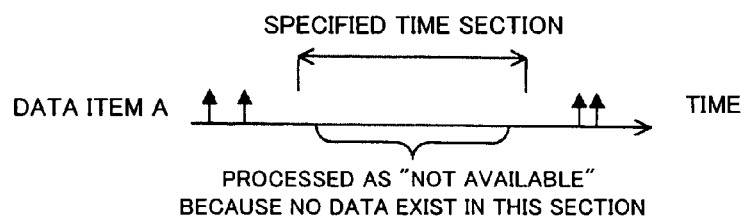
Figure 6C:
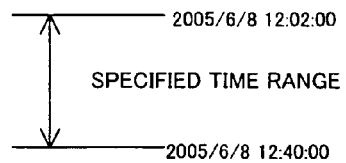

This will be described more concretely with reference to FIG. 6(c). First, in a case where the duration time for which the wafer transfer machine A is under "charging" is required to be calculated, in the normal data obtaining processing, data of "on standby" of 12:02:34 of (2) and "under discharging" of 12:36:05 of (3) are obtained when the specified time range is a range shown in FIG. 6(c) (that is, the range from 12:02:00 to 12:40:00). However, the duration time of "under charging" cannot be calculated by only the data of (2), (3). Therefore, if the data of the time of (1, (2), (3) can be obtained by adding "under charging" of 12:01:59 of (1) which is one past point at the outside of the time range, the duration time of "under charging" can be calculated. That is, the time from the "under charging" of (1) till "on standby" of (2) corresponds to the duration time of "under charging".

Furthermore, when the duration time for which the wafer transfer machine A is "under discharging" is required to be calculated, and also when the specified time range is the range (that is, the range from 12:02:00 to 12:40:00), the duration time of "under discharging" cannot be calculated by only the data of "on standby" of 12:02:34 of (2) and "under discharging" of 12:36:05 of (3). Therefore, if the data of (2), (3) and (4) can be obtained by adding the data of "on standby" of 12:45:13 of (4) which is one future point at the outside of the time range, the duration time of "under discharging" can be calculated. That is, the time from the "under discharging" of (3) till "on standby" of (4) corresponds to the duration time of "under discharging".

As described above, the data are obtained so that both (one) of the duration time under the state at the head of the specified time range and the duration time under the state at the last of the specified time range can be calculated. However, when no data occurs with respect to the specified time range as shown in FIG. 6(b), the search of data as shown in FIG. 6(a) is insignificant, and thus it is handled as if no data exists. That is, NG is judged in step S23 and then the processing is finished.

Returning to the flowchart of the duration time inspecting program of FIG. 5 again, data are obtained again in step S23, and then previously obtained data are analyzed to calculate the duration time of the specified state, thereby duration time conversion processing is executed (step S24).

Subsequently, as in the case of the upper and lower limit judgment processing of the step S4 of the inspecting program of FIG. 3, the upper and lower limit values of the data specified in step S22 and the data obtained in step S23 are compared with each other to judge the upper and lower limits, thereby the upper and lower limit judgment processing is executed (step S25).

If the obtained data does not exceed the upper and lower limit values in step S25, "OK" is set and then the program is finished. If the obtained data exceed the upper and lower limit values, "NG" is set, and then the NG processing of step S26 is executed. In this case, a method of executing the NG processing is the same as the execution method of the NG processing of the step S5 of the inspecting program of FIG. 3, and thus the duplicative description thereof is omitted.

In the inspecting program, the step S1 and the step S21 constitute the search specifying step, the step S2 and the step S22 constitute the upper and lower limit indicating step, the step S3 and the step S23 constitute the data obtaining step, the step S4 and the step S25 constitute the judging step and the step S24 constitute the duration time conversion step of the present invention.

In this embodiment, the event of the transfer machine has been described in detail. The same can be executed with respect to other boat events such as "boat UP", "boat Down". Furthermore, the same can be also executed with respect to a vacuuming event.

With respect to the monitor data (temperature, gas flow rate, etc.), event data for judging that data are converged to a predetermined target value is created in advance, whereby it is unnecessary to monitor and check all the data of the temperature and the flow rate to decrease the data load.

By monitoring the duration time of the event data, abnormality of the part corresponding to the event can be easily detected, and the dispersion in the processing time of the respective events can be monitored. In this case, each step time can be monitored, and thus the reliability of the apparatus can be checked.

[Part 1 of Search Condition Determining Processing]

Figure 7:
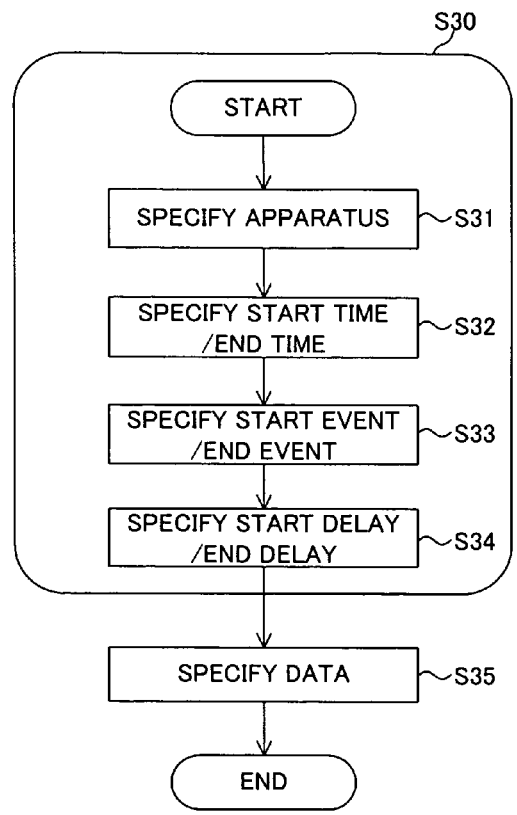
FIG. 7 is a flowchart showing the flow of the processing of determining a search condition for a search method according to the substrate processing system of the present invention.

Next, the processing of determining the search condition specified in step S1 of the inspecting program will be described. FIG. 7 is a flowchart showing the flow of the processing of determining the search condition for the search method according to the substrate processing system of the present invention. Here, the time specification of the search condition is determined through a successive processing from the apparatus specification in step S31 till the specification of the start delay/end delay of step S34 which is processed in step S30. In step S30, a plurality of time specifications can be determined in parallel, and plural determination contents can be coupled to one another by OR.

The search condition determining processing is first executed by carrying out the apparatus specification processing of specifying the semiconductor manufacturing apparatus 1 targeted by the user (step S31). At this time, when a plurality of semiconductor manufacturing apparatuses 1 from which data should be collected are connected to each another, one semiconductor manufacturing apparatuses 1 is selected from them. The selected semiconductor manufacturing apparatus 1 is used to limit the event in the processing of the subsequent step S33.

Subsequently, start time and end time specifying processing is executed (step S32) by specifying rough start time and end time for performing the search by the user. Here, it is unnecessary for the user to specify accurate start time and end time for data which the user wants to obtain.

Subsequently, start event/end event specifying processing is executed (step S33) by specifying an abstract time indicated by an event. Here, the event represents the time at which the state of each element part constituting the semiconductor manufacturing apparatus 1 varies, such as "the time at which the valve is changed from OFF to ON", "the time at which MFC is set from the standby state to the control start state" or the like, and the concrete time can be obtained from the collected apparatus data.

The setting of the time in step S33 is used to further narrow the time specified in step S32, whereby the desired data can be searched even when the accurate event start and end times are unknown.

Subsequently, the start delay and end delay specifying processing is executed by setting a delay time applied to the start time and the end time. By setting this time, data at a past time that went back during delay time specified at the start time of the event set in step S33 or data at a prospective time which elapses the delay time at the end time of the event set in step S33 can be obtained.

By setting all the data in the processing from the step S31 till the step S34 as described above, the concrete search start time and end time are determined. However, it is not necessarily required to set all the start/end time of the step S32, the event start/end time of the step S33 and the delay start/end time of the step S34, and by setting any one of the start/end time of the step S32 and the event start/end time of the step S33, the other times are not daringly required to be set if it is unnecessary to set them. For example, when the start time and the end time have been already determined as in the case of the conventional method, only the start/end time of the step S32 may be merely set in this invention. Furthermore, when plural semiconductor manufacturing apparatuses 1 are searched under the same condition, another semiconductor manufacturing apparatus 1 may be specified in another condition which is determined in a multiple and parallel style in the processing of the step S30.

Subsequently to the step S30, data specifying processing is executed (step S35) by specifying a data point which the user wants to obtain. At this time, plural data can be specified over the plural semiconductor manufacturing apparatuses 1. As described above, a search condition of one time is determined and data are searched on the basis of the search condition.

Figure 8:
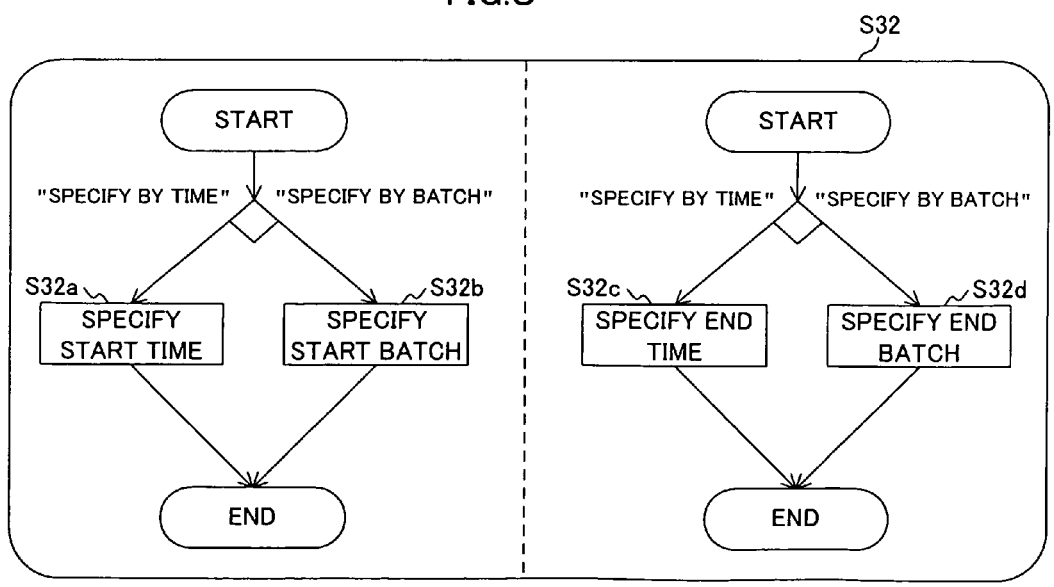
FIG. 8 is a flowchart showing the flow of the detailed processing of indicating start/end times shown in step S32 of FIG. 7.

In place of the mere specification of the start time and the end time in step S32 of FIG. 7, the start time and the end time can be specified by the time and the batch as shown in FIG. 8. FIG. 8 is a flowchart showing the flow of the detailed processing of the start/end time specification shown in the step S32 of FIG. 7. A broken line dividing the flowchart of FIG. 8 means the parallel processing.

That is, as shown in the flowchart at the left side of FIG. 8, when the start time and the end time are specified by the time, the start time is specified (step S32a). When the start time and the end time are specified by the batch, the start batch is specified (step S32b). Furthermore, in the flowchart at the right side of FIG. 8, when the start time and the end time are specified by the time, the end time is specified (step S32c), and when the start time and the end time are specified by the batch, the end batch is specified (step S32d).

The batch specification may be applied to any one of "start" and "end" in place of the time specification. When the start batch is specified as in the case of the step S32b, the start time of the batch concerned serves as the start time of the data search, and when the end batch is specified as in the case of the step S32d, the end time of the batch concerned serves as the end time of the data search. The batch specification which can be easily grasped on the management is used in place of the concrete start time and end time, whereby the data search can be performed flexibly and accurately.

[Part 2 of Search Condition Determining Processing]

Figure 9:
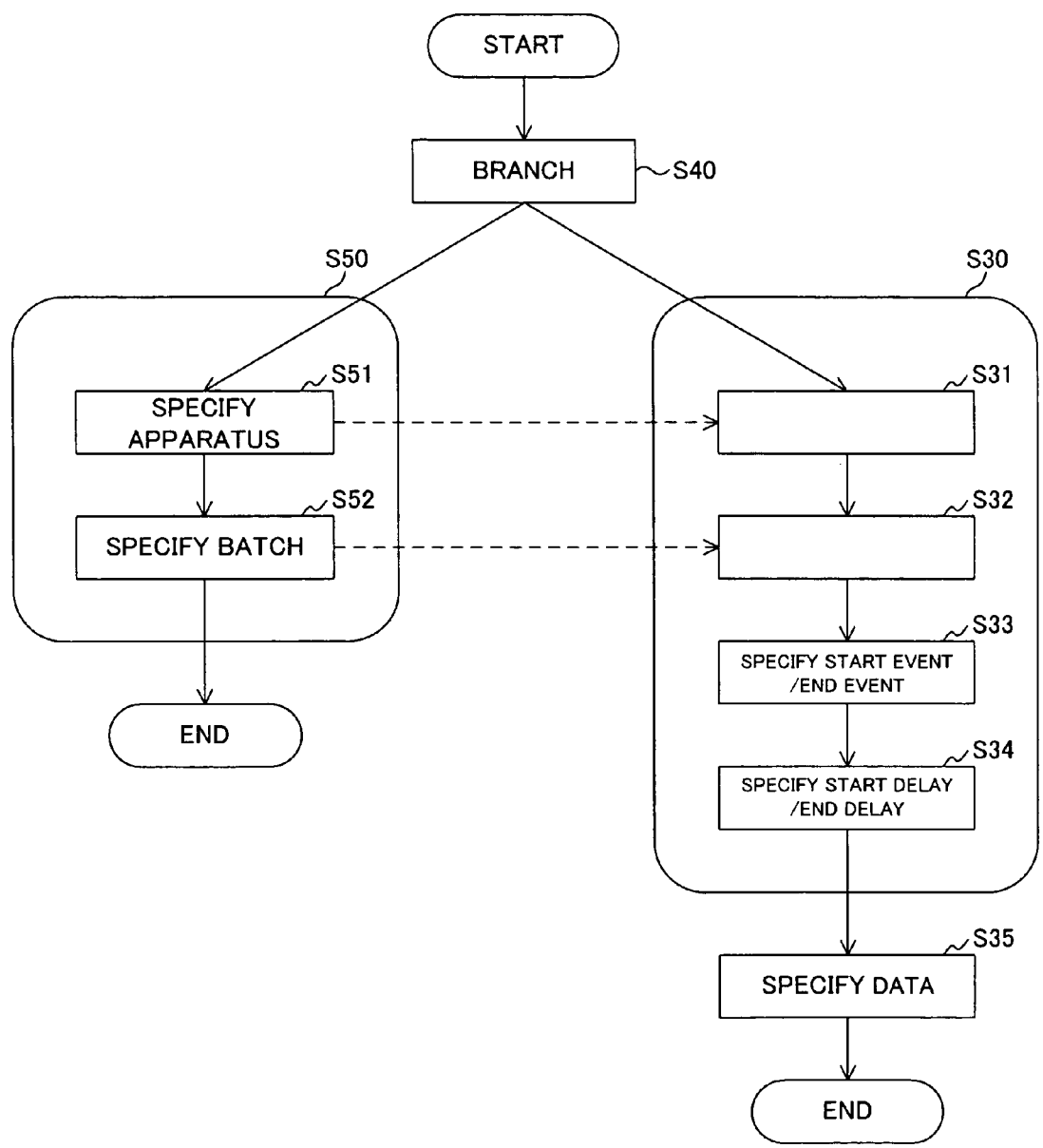
FIG. 9 is a flowchart showing the flow of the processing of determining a search condition for another search method according to the substrate processing system of the present invention.

Next, another search method according to the present invention will be described with reference to FIG. 9. FIG. 9 is a flowchart showing the flow of the processing of determining the search condition for another search method according to the substrate processing system of the present invention.

The flowchart of FIG. 9 is branched to two systems (that is, the system of step S30 and the system of step S50) in branch processing of step S40. The processing of the system of the step S30 is the same as the flow of the search condition determining processing shown in FIG. 7, and thus the description thereof is omitted. Furthermore, the processing of the step S30 and the processing of the step S50 can be simultaneously executed in parallel.

Next, the processing of step S50 will be described. First, the apparatus specifying processing is executed (step S51) by specifying the semiconductor manufacturing apparatus 1 targeted by the user. Subsequently, the batch specifying processing is executed (step S52) by specifying a batch in the semiconductor manufacturing apparatus 1 specified in step S51, and then the processing is finished. These series of processing can be determined on a unit-basis in the multiple and parallel style, and plural determined set contents are coupled to one another by OR, so that a plurality of sets each of which comprises the semiconductor manufacturing apparatus 1 and the batch carried out in the apparatus are set, and coupled to one another by OR.

Furthermore, as indicated by a dashed-line arrow, the processing of the apparatus specification of the step S31 is replaced by the processing of the apparatus specification of the step S51 and set. The processing of specifying the start time/end time of the step S32 is replaced by the processing of the batch specification of the step S52.

FIG. 10 is a more detailed diagram showing the effect of the plural sets of apparatuses and batches set in the processing of the step S50 shown in FIG. 9. FIG. 10(a) shows a case where the pair of the apparatus and the batch is not set in the processing of the step S50 shown in FIG. 9. In this case, the pair of the apparatus and the batch is not specified, and thus the time specification set in the step S30 which is displayed as "search condition list" is directly set as the final time specification of the search condition. For example, an apparatus A, a batch 1, a start event ◇ and an end event Δ in the "search condition list" are directly set as an apparatus A, a batch 1, a start event ◇ and an end event Δ in the "final search condition".

FIG. 10 (b) shows a case where plural pairs of apparatuses and batches are set in the processing of the step S50 shown in FIG. 9. In this case, each of the items of the "search condition list" and each of the plural pairs of the apparatuses and the batches specified in the processing of the step S50 displayed as "apparatus/batch" are combined with each other, and set as a final search condition. For example, by the times of the apparatus A, the batch 1, the start event ◇ and the end event A in the "search condition list" and the times of the apparatus B and the batch 3 in the "apparatus/batch list", they are changed to the times of the apparatus B, the batch 3, the start event ◇ and the end event Δ in the "final search condition".

[Adaptation to Plural Events]

In the search method based on the substrate processing system of the present invention, the start/end time may be specified by an event occurring in the apparatus in place of the concrete time. However, since the start/end time is specified by the event, there may occur a case where many events unexpected by the user occur at the time which is roughly set in the step S32 of FIG. 7. Therefore, when plural concrete times correspond to the start event and the end event in step S33 of FIG. 7, they are associated with one another as shown in FIG. 11.

That is, FIG. 11 is a diagram showing a case where the start event and the end event of the step S33 of FIG. 7 are dealt with by using plural events, and "start trigger time" at the left side of FIG. 11 is a list of concrete times corresponding to the start event of the step S33 in FIG. 7. Furthermore, "end trigger time" at the right side of FIG. 11 is a list of concrete times corresponding to the end event of the step S33 of FIG. 7.

The respective times are arranged in order of occurrence, and when the two head times are compared with each other and when the start event is earlier than the end event, these events are associated with each other as a pair, and they are shifted to the next times. If not so, the head time of the end event is neglected, the time of the start event is left as it is, and only the end event is shifted to the next time and compared again. This operation is repeated, whereby the search condition can be prevented from being made insignificant by an event unexpected by the user.

[Concrete Embodiments of Data Search]

FIG. 12 is a diagram showing a first embodiment of the data search in the substrate processing system of the present invention. In the first embodiment, the data search period in the case of one specified apparatus, one specified batch and one specified event condition is indicated. In the specified event condition of this case, the search start is an event 1, and the search end is an event 2. In FIG. 12, (a) shows a search period in the case of one event. (b) shows a search period in the case of two events. In (c), there are two event start conditions, and there are three event end conditions. The number of the start conditions is smaller than that of the end conditions, and thus "event 2" of the third end condition is neglected because it has no start condition to be paired. Accordingly, there are two search periods. In (d), there are three event start conditions, and there are two end conditions. Therefore, the number of the start conditions is larger than that of the end condition, and the "event 1" of the third opening condition is neglected because it has no end condition to be paired. Accordingly, there are two search periods.

FIG. 13 is a diagram showing a second embodiment of the data search in the substrate processing system of the present invention. In the second embodiment, the data search period in the case of two specified apparatuses, two specified batches and one specified event condition is provided. In the event condition of this case, the search start is the event 1, and the search end is the event 2. In the search period, one apparatus A and one apparatus B are provided.

FIG. 14 is a diagram showing a third embodiment of the data search in the substrate processing system. In the third embodiment, the data search period in the case of one specified apparatus, two specified batches and one specified event condition is provided. In the event condition of this case, the search start is the event 1, and the search end is the event 2. In the search period, one batch 1 and one batch 2 are provided.

FIG. 15 is a diagram showing a fourth embodiment of the data search in the substrate processing system of the present invention. In the fourth embodiment, the data search period in the case of one specified apparatus, one specified batch and plural specified event conditions is indicated. In the event condition 1 of this case, the search start is the event 1, and the search end is the event 2. In the event condition 2, the search start is the event 3, and the search end is the event 4. There are two search periods.

FIG. 16 is a diagram showing a fifth embodiment of the data search in the substrate processing system of the present invention. In the fifth embodiment, the data search period in the case of one specified apparatus, the time specification in place of the batch specification and one specified event condition is indicated. In the event condition of this case, the search start is the event 1, and the search end is the event 2. The search period is from a time before the start of the batch 1 till a time before the end of the batch 2 and one.

FIG. 17 is a diagram showing a sixth embodiment of the data search in the substrate processing system of the present invention. In the sixth embodiment, the data search period in the case of one specified apparatus, the time specification in place of the batch and plural specified event conditions is provided. In the event condition 1 of this case, the search start is the event 1, and the search end is the event 2. In the event condition 2, the search start is the event 3, and the search end is the event 4. One search period is provided from a time before the start of the batch 1 till a time of some midpoint of the batch 1, and another search period is provided from a time of some midpoint of the batch 2 till a time after the end of the batch 2, that is, totally two search periods are provided.

FIG. 18 is a diagram showing a seventh embodiment of the data search in the substrate processing system of the present invention. In the seventh embodiment, the data search period in the case of one specified apparatus, sequential start batch and end batch as the specified batch and one specified event condition is indicated. In the event condition of this case, the search start is the event 1, and the search end is the event 2. One search period is provided from a time of some midpoint of the batch 1 till a time after the end of the batch 2.

FIG. 19 is a diagram showing an eighth embodiment of the data search in the substrate processing system of the present invention. In the eighth embodiment, the data search period in the case of one specified apparatus, sequential start batch and end batch as the specified batch and plural specified events is indicated. In the event condition 1 of this case, the search start is the event 1 and the search end is the event 2. In the event condition 2, the search start is the event 3, and the search end is the event 4. One search period is provided from a time of some midpoint of the batch 1 till a time before the start of the batch 2, and another search period is provided from a time after the end of the batch 2 till a time of some midpoint of the batch 3, that it, totally two search periods are provided.

As described above, according to the search method of the present invention, there is a case where a plurality of pairs each of which comprises a search start time and a search end time indicating a search period exist. Therefore, a search result for a search condition is constructed as shown in FIG. 24.

That is, FIG. 24 is a conceptual diagram showing the construction of the search result. 900 represents the overall search result, and has a search condition 910, a metadata 912 and an assembly 916 of real data. The search condition 910 is the whole information concerning the search condition determined through the processing of FIG. 7 or 9. The assembly 916 of the real data is constructed by a fragment 918 of real data occurring in the data information specified in step S35, and there exist assemblies 916 whose number is equal to the number of specified data points. In the fragment 918 of the real data, the real data corresponding to a pair of concrete start and end times out of the real data occurring in the data information specified in step S35 is set as a lump. The content of the fragment 918 contains a plurality of pairs each of which comprises an occurrence time and a numerical value, a theoretical value or a state at that time. The fragment 918 of the real data is added with information of the pair of the concrete start and end times contained in the search condition 910, whereby the fragment 918 is constructed to be easily understood and handled.

Furthermore, metadata 912 are data pieces whose number is equal to the number of assemblies 916 of real data, and which are associated with the assemblies 916 in one-to-one correspondence, and also the metadata 912 is an additional element taking a supplementary role to understand the meaning of the assembly 916 of the real data. The double line 914 indicates correspondence of one to one.

The substrate processing apparatus applied to the substrate processing system of the present invention is applied to not only the semiconductor manufacturing apparatus, but also an apparatus of processing a glass substrate such as an LCD device or the like. Furthermore, irrespective of the content of the processing to be executed in the substrate processing apparatus, the film forming processing contains the processing of forming CVD, PVD, oxide film, nitride film, the processing of forming film containing metal, etc. Furthermore, an anneal treatment, an oxidizing treatment, a nitriding treatment, a diffusion treatment or the like may be conducted. The substrate processing system of the present invention may be constructed so that the inspecting device for inspecting data and the data collecting device are joined to each other.

[Embodiments of Substrate Processing Apparatus]

Figure 20:
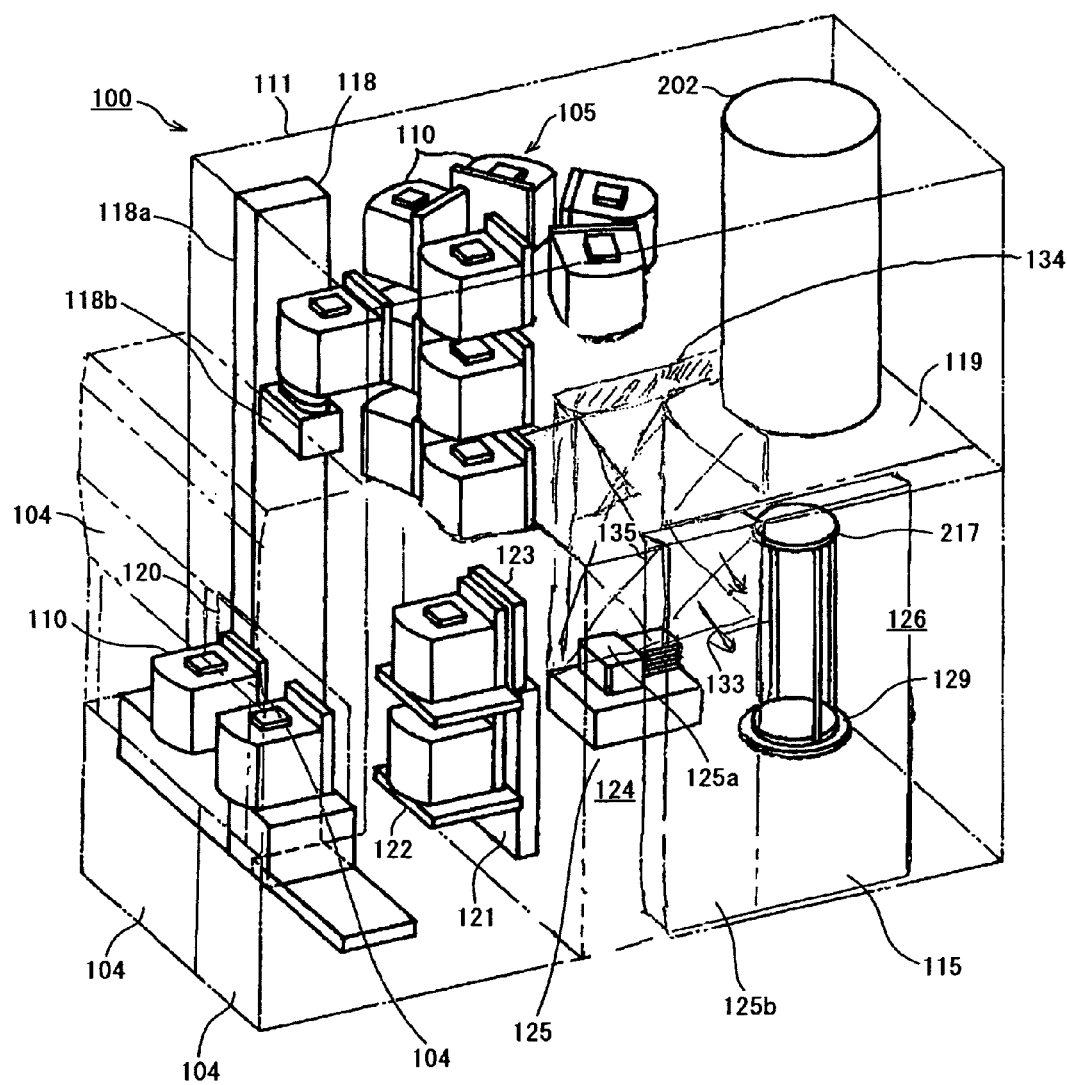
FIG. 20 is a perspective view showing a substrate processing apparatus applied to the present invention.

Next, embodiments of the substrate processing apparatus applied to the present invention will be described. In the best mode for carrying out the invention, the substrate processing apparatus is constructed as a semiconductor manufacturing apparatus for executing processing steps in a method of manufacturing a semiconductor device as an example. In the following description, a vertical type substrate processing apparatus (hereinafter referred to as a processing apparatus) for executing an oxidation, diffusion treatment, a CVD treatment, etc. on a substrate is applied as the substrate processing apparatus. FIG. 20 is a perspective view showing the substrate processing apparatus applied to the present invention. Furthermore, FIG. 21 is a side perspective view of the substrate processing apparatus shown in FIG. 20.

Figure 21:
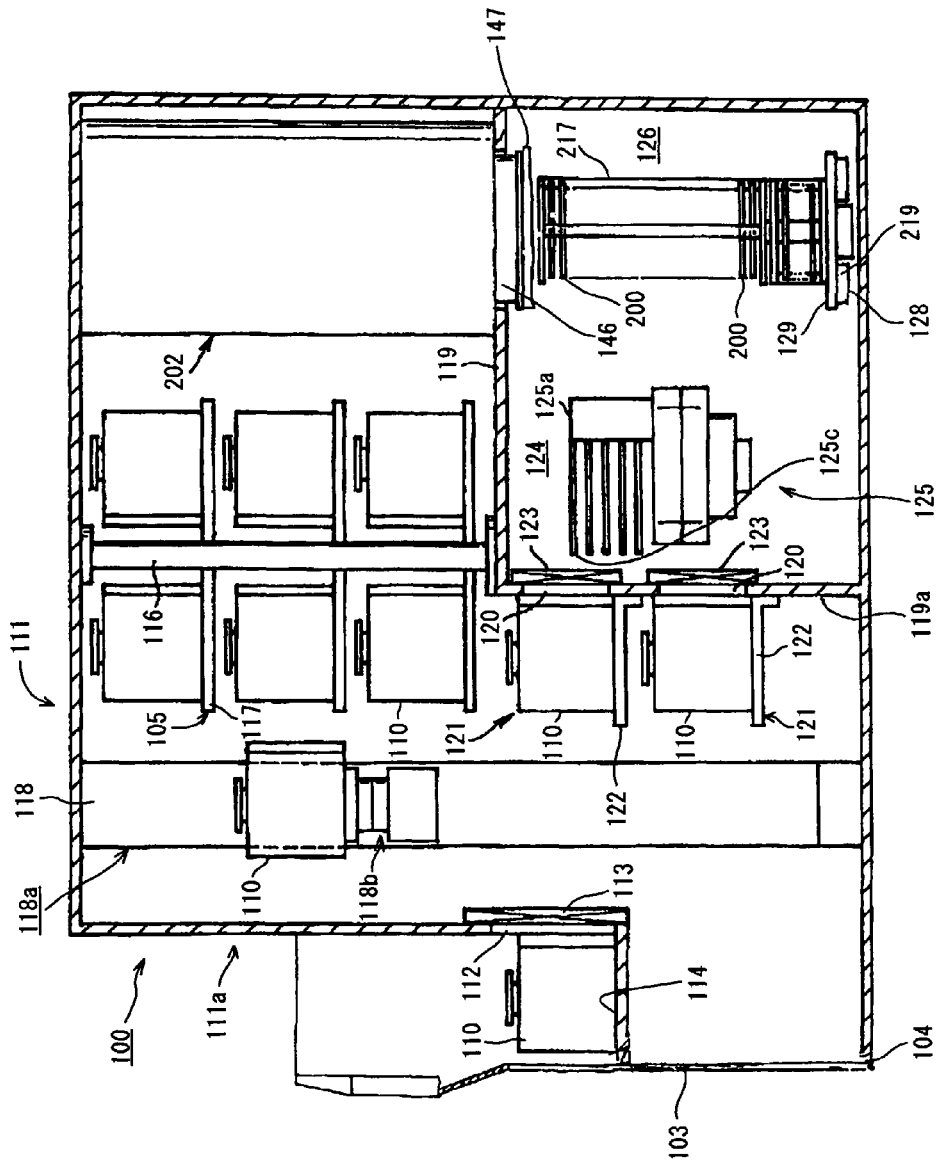
FIG. 21 is a side perspective view of the substrate processing apparatus shown in FIG. 20.

As shown in FIGS. 20 and 21, a processing apparatus 100 of the present invention in which a FOUP (Front Opening Unified Pod, hereinafter referred to as pod) 110 is used as a wafer carrier for accommodating wafer (substrate) 200 formed of silicon or the like is equipped with a housing 111. A front maintenance port 103 as an opening portion which is provided so as to enable maintenance is formed at the front and forward portion of the front wall 111a of the housing 111, and front maintenance doors 104, 104 for opening/closing the front maintenance port 103 are constructed.

A pod feed-in/out port (substrate container feed-in/out port) 112 is formed in the front wall 111a of the housing 111 so that the inside and outside of the housing 111 intercommunicate with each other through the pod feed-in/out port 112, and the pod feed-in/out port 112 is opened/closed by a front shutter (an opening/closing mechanism for the substrate container feed-in/out port) 113.

A charging port (substrate container delivery stand) 114 is disposed at the front and forward side of the pod feed-in/out port 112, and the charging port 114 is constructed so that the pod 110 is mounted and positioned. The pod 110 is fed in onto the charging port 114 by an in-process feeding device (not shown), and also fed out from the charging port 114.

A rotational pod shelf (substrate container mount shelf) 105 is disposed at the upper side of the substantially center portion in the front-and-rear direction in the housing 111, and the rotational pod shelf 105 is designed so that plural pods 110 are stored. That is, the rotational pod shelf 105 has a support pole 116 which is disposed erectly in the vertical direction and intermittently rotated within a horizontal plane, and plural shelf plates (substrate container mount tables) 117 which are radially supported at the respective positions in the upper, middle and lower stages by the support pole 116, and the plural shelf plates 117 are designed so as to hold plural pods 110 while they are mounted on the shelf plates 117.

A pod feeding device (substrate container feeding device) 118 is disposed between the charging port 114 and the rotational pod shelf 105 in the housing 111, and comprises a pod elevator (substrate container elevating mechanism) 118a for elevating a pod 110 while holding the pod 110, and a pod feeding mechanism (substrate container feeding mechanism) 118b as a feeding mechanism. The pod feeding device 118 feeds the pod 110 among the charging port 114, the rotational pod shelf 105 and the pod opener (substrate container lid opening/closing mechanism) 112 through the sequential operation of the pod elevator 118a and the pod feeding mechanism 118b.

A sub housing 119 is constructed at the lower portion of the substantially center portion in the front-and-rear direction in the housing 111 so as to extend to the rear end of the housing 111. A pair of wafer feed-in/out ports (substrate feed-in/out ports) 120 for feeding in/out wafers 200 into/from the sub housing 119 are formed in the front wall 119a of the sub housing 119 so as to be arranged at two upper and lower stages in the vertical direction, and a pair of pod openers 121, 121 are disposed at the wafer feed-in/out ports 120, 120 at the upper and lower stages.

The pod opener 121 is equipped with mount tables 122, 122 for mounting the pods 110, and cap attaching/detaching mechanisms (lid attaching/detaching mechanisms) 123, 123 for attaching/detaching caps (lid body) of the pods 110. The pod opener 121 attaches/detaches the caps of the pods 110 mounted on the mount tables 122 by the cap attaching/detaching mechanisms 123, thereby opening/closing the wafer feed-in/out ports of the pods 110.

The sub housing 119 constitutes a transfer chamber 124 which is fluidically insulated from the mount space of the pod feeding device 118 and the rotational pod shelf 105. A wafer transfer machine (substrate transfer mechanism) 125 is disposed at the front-side area of the transfer chamber 124, and the wafer transfer mechanism 125 is constructed by a wafer transfer device (substrate transfer device) 125 which can rotate the wafer 200 in the horizontal direction or move the wafer 200 straightly, and a wafer transfer device elevator (substrate transfer device elevating mechanism) 125b for elevating the wafer transfer device 125a. As shown schematically in FIG. 20, the wafer transfer device elevator 125b is disposed between the right end portion of a pressure-proof housing 111 and the right end portion of the front-side area of the transfer chamber 124 of the sub housing 119. Through the sequential operation of the wafer transfer device elevator 125b and the wafer transfer device 125a, the wafer 200 is charged (charged) to and discharged (discharged) from the boat (substrate holding member) 217 with a tweezer (substrate holding body) 125c of the wafer transfer device 125a as a mount portion for the wafer 200.

A standby portion 126 for keeping the boat 217 on standby while the boat 217 is accommodated in the standby portion 126 is constructed in the rear-side area of the transfer chamber 124. A treatment furnace 202 is provided above the standby portion 126. The lower end portion of the treatment furnace 202 is opened/closed by a furnace port shutter (furnace port opening/closing mechanism) 147.

As shown schematically in FIG. 20, a boat elevator (substrate holding member elevating mechanism) 115 for elevating the boat 217 is disposed between the right-side end portion of the pressure-proof housing 111 and the right end portion of the standby portion 126 of the sub housing 119. A seal cap 219 as a lid is horizontally fixed to an arm 128 as a joint member joined to the elevating table of the boat elevator 115, and the seal cap 219 is designed to support the boat 217 vertically so that the lower end portion of the treatment furnace 202 can be closed.

The boat 217 has plural holding members, and holds plural (for example, about 50 to 125) wafers 200 in a horizontal position under the state that the centers thereof are aligned with one another in the vertical direction.

As shown schematically in FIG. 20, a clean unit 134 which is constructed by a supply fan and a dust-proof filter so as to supply clean air 133 such as cleaned atmosphere air or inert gas is disposed at the left-side end portion opposite to the wafer transfer device elevator 125b side and the boat elevator 115 side in the transfer chamber 124, and a notch matching device 135 as a substrate alignment device for aligning the position in the circumferential direction of the wafer (not shown) is disposed between the wafer transfer device 125a and the clean unit 134.

The clean air 133 blown out from the clean unit 134 flows through the notch matching device 135, the wafer transfer device 125a and the boat 217 at the standby portion 126, and then sucked in by a duct (not shown) to be exhausted to the outside of the housing 111 or circulated to the primary side (supply side) as the suction side of the clean unit 134 and then blown into the transfer chamber 124 again by the clean unit 134.

Next, the operation of the processing apparatus according to the present invention will be described. As shown in FIGS. 20 and 21, when the pod 110 is supplied to the charging port 114, the pod feed-in/out port 112 is opened by the front shutter 113, and the pod 110 on the charging port 114 is fed in from the pod feed-in/out port 112 into the housing 111 by the pod feeding device 118.

The fed-in pod 110 is automatically fed and delivered to an indicated shelf plate 117 of the rotational pod shelf 105 by the pod feeding device 118 and temporarily stored therein, and then it is fed from the shelf plate 117 to one pod opener 121 and transferred to the mount table 122. Alternatively, it is directly fed to the pod opener 121 and transferred to the mount table 122. At this time, the wafer feed-in/out port 120 of the pod opener 121 is closed by the cap attaching/detaching mechanism 123, and the transfer chamber 124 is filled with clean air 133. For example, nitrogen gas is filled as the clean air 133 in the transfer chamber 124, whereby the oxygen concentration of the transfer chamber 124 is set to 20 ppm or less which is a remarkably lower value than the oxygen concentration of the inside (atmosphere air) of the housing 111.

With respect to the pod 110 mounted on the mount table 122, the opening-side end face thereof is pushed against the opening edge side portion of the wafer feed-in/out port 120 in the front wall 119a of the sub housing 119, and the cap thereof is detached by the cap attaching/detaching mechanism 123, thereby opening the wafer take-in/out port.

When the pod 110 is opened by the pod opener 121, the wafer 200 is picked up through the wafer take-in/out port by the tweezer 125c of the wafer transfer device 125a, and aligned by the notch matching device 135. Thereafter, the wafer is fed into the standby portion 126 behind the transfer chamber 124, and charged to the boat 217. The wafer transfer device 125a from which the wafer 200 is delivered to the boat 217 is returned to the pod 110, and charges the next wafer 110 to the boat 217.

During the charging work of the wafer to the boat 217 by the wafer transfer mechanism 125 in one (upper or lower) pod opener 121, another pod 110 is fed and transferred from the rotational pod shelf 105 by the pod feeding device 118 into the other (lower or upper) pod opener 121, and the opening work of the pod 110 by the pod opener 121 progresses simultaneously.

When wafers 200 whose number is specified in advance are charged to the boat 217, the lower end portion of the treatment furnace 202 closed by the furnace port shutter 147 is opened by the furnace shutter 147. Subsequently, the boat 217 holding a group of wafers 200 is fed (charged) into the treatment furnace 202 upon the upward movement of the seal gap 219 by the boat elevator 15.

After the charging, any treatment is conducted on the wafers 200 in the treatment furnace 202. After the treatment, the wafers 200 and the pod 110 are fed out to the outside of the housing 111 in the reverse procedure to the procedure described above except for the wafer aligning step in the notch matching device 135.

As a substrate treatment system according to a preferred embodiment of the present invention, in a substrate processing system comprising at least one substrate processing apparatus for executing a desired processing on a substrate, a data collecting device that collects data from the substrate processing apparatus and has a storage unit for storing the collected data, and an inspecting device for inspecting data accumulated in the storage unit, the inspecting device comprises:

search specifying step of searching the data accumulated in the storage unit under a prescribed search condition;

upper and lower limit specifying step of specifying upper limit value and lower limit value of the data at a desired time interval;

data obtaining step of specifying data from the storage unit; and judging step of judging whether the data obtained by the data obtaining step is within a range specified by the upper and lower limit indicating step, wherein the data represents an event and a time period for which the event data is continued is inspected.

Furthermore, as a substrate processing system according to a preferred embodiment of the present invention, in a substrate processing system comprising at least one substrate processing apparatus constructed by plural parts, a data collecting device that collects data from the substrate processing apparatus and has a storage unit for storing the collected data, and an inspecting device for analyzing and inspecting the data accumulated in the storage unit, the inspecting device comprises:

search specifying step of specifying search of the data accumulated in the storage unit under a prescribed condition;

upper and lower limit specifying step of specifying upper limit value and lower limit value of data to be searched by the search specifying step by time;

data obtaining step of obtaining data from the storage unit;

duration time calculating step of calculating a time for which the data obtained by the data obtaining step are continued under a prescribed state; and judging step of judging whether the data obtained by the data obtaining step is within a range specified by the upper and lower limit specifying step.

Still furthermore, in a substrate processing system according to a preferred embodiment of the present invention, when a preset state is finished, the inspecting device obtains data to have gone back only during the fixed time that has been being set beforehand since present, and inspects data obtained after it is judged whether the state is the preset state or not.

Furthermore, in a substrate processing system of a preferred embodiment of the present invention, a method of inspecting the operation of a semiconductor manufacturing apparatus may be provided. That is, there is provided an operation inspecting method for collecting data from at least one substrate processing apparatus for conducting a desired processing on a substrate by a data collecting device, storing the collected data into storage unit of the data collecting device and inspecting the data stored in the storage unit by an inspecting device, wherein the inspection of the inspecting device specifies searching of the data accumulated in the storage unit under a prescribed condition by search specifying step, specifies upper limit value and lower limit value of data at a desired time interval when data to be searched by upper and lower limit value specifying step varies with time lapse, obtains data from the storage unit by data obtaining step, and then judges by judging step whether the data obtained by the data obtaining step is within a range specified by the upper and lower limit value specifying step.

Furthermore, in a method of inspecting the operation of a semiconductor manufacturing apparatus in a substrate processing system according to a preferred embodiment of the present invention, which collects data from at least one substrate processing apparatus for conducting a desired processing on a substrate by a data collecting device, stores the collected data into storage unit of the data collecting device and inspects the data stored in the storage unit by an inspecting device, the inspection of the inspecting device specifies searching of the data accumulated in the storage unit under a prescribed condition by search specifying step, specifies upper limit value and lower limit value of data with times by upper and lower limit value specifying step, obtains data from the storage unit by the data obtaining step, calculates a time for which the data obtained by duration time calculating step is continued under a prescribed state, and then judges by judging step whether the obtained data is within a range specified by the upper and lower limit value specifying step.

INDUSTRIAL APPLICABILITY

According to the substrate processing system of the present invention, the inspection of the operation of parts of the semiconductor manufacturing apparatus can be automatically performed without increasing the load of the main controller of the semiconductor manufacturing apparatus. Therefore, it can be inspected whether the parts constituting the semiconductor manufacturing apparatus operate normally. Accordingly, subtle abnormality before a part breaks down can be detected. Furthermore, dispersion in operation time among respective parts can be monitored, and thus reliability of the semiconductor manufacturing apparatus can be checked.

The invention claimed is:

1. A substrate processing system comprising at least one substrate processing apparatus to execute a desired processing on a substrate, a data collecting device that collects data from the substrate processing apparatus and comprising a storage unit for storing the collected data, and an inspecting device to inspect data accumulated in the storage unit, the inspecting device comprising:
   a search specifying unit that searches the data accumulated in the storage unit for data within a predetermined period;
   an upper and lower limit specifying unit that specifies an upper limit value and a lower limit value of a time;
   a data obtaining unit that obtains data from the storage unit; and
   a judging unit that judges whether the obtained data is within a range specified by the upper and lower limit specifying unit,
   wherein, when a preset state is finished at a time of obtaining the data within the predetermined period, the data obtaining unit further obtains the data within a predetermined definite period of time to go back to a past time from a time of head data of the obtained data, and
   wherein the judging unit judges whether the data obtained by the data obtaining unit is within the range between the upper and the lower limit values specified by the upper and lower limit value specifying unit.

2. The substrate processing system according to claim 1, wherein the data obtained by the data obtaining unit comprises event data indicating a change of a state, and wherein the judging unit judges whether the event data indicates the preset state, and inspects a duration of the preset state by comparing the duration with the upper and lower limit values at an end time of the event data.

3. An operation inspecting method for inspecting data by using an inspecting device, the inspecting device comprising:
   a search specifying unit that searches data accumulated in a storage unit for data within a predetermined period, the accumulated data being collected from at least one substrate processing apparatus configured to conduct a desired processing on a substrate;
   an upper and lower limit specifying unit that specifies an upper limit value and a lower limit value of a time;
   a data obtaining unit that obtains data from the storage unit; and
   a judging unit that judges whether the obtained data is within a range specified by the upper and lower limit specifying unit,
   wherein the method comprises
   judging, by the judging unit, whether the obtained data is within a range between the upper limit value and the lower limit value specified by the upper and lower limit value specifying unit, and
   wherein, when a preset state is finished at a time of obtaining the data within the predetermined period, the data obtaining unit further obtains the data within a predetermined definite period of time to go back to a past time from a time of head data of the obtained data.

4. The substrate processing system according to claim 1, wherein the collected data comprises event data indicating a change of a preset state, and
   wherein the judging unit judges whether an end time of the event data is within the range between the upper and lower limit values.

5. An inspecting device to inspect data which is collected from at least one substrate processing apparatus to execute a desired processing on a substrate and is accumulated in a storage unit, the inspecting device comprising:
   a search specifying unit that searches the data accumulated in the storage unit for data within a predetermined period;
   an upper and lower limit specifying unit that specifies an upper limit value and a lower limit value of a time;
   a data obtaining unit that obtains data from the storage unit based on the search; and
   a judging unit that judges whether the obtained data is within a range specified by the upper and lower limit specifying unit,
   wherein, when a preset state is finished at a time of obtaining the data within the predetermined period, the data obtaining unit further obtains the data within a predetermined definite period of time to go back to a past time from a time of head data of the obtained data, and
   wherein the judging unit judges whether the obtained data is within the range between the upper and lower limit values specified by the upper and lower limit value specifying unit.

6. The inspecting device according to claim 5, wherein the collected data comprises event data indicating a change of a preset state, and
   wherein the judging unit judges whether an end time of the event data is within the range between the upper and lower limit values.

7. The inspecting device according to claim 5, wherein the data obtained by the data obtaining unit comprises event data indicating a change of a state, and wherein the judging unit judges whether the event data indicates the preset state, and inspects a duration of the preset state by comparing the duration with the upper and lower limit values at an end time of the event data.

8. The operation inspecting method according to claim 3, wherein the collected data comprises event data indicating a change of a preset state, and wherein the judging unit judges whether an end time of the event data is within the range between the upper and lower limit values.

9. The operation inspecting method according to claim 3, wherein the data obtained by the data obtaining unit comprises event data indicating a change of a state, and wherein the judging unit judges whether the event data indicates the preset state, and inspects duration of the preset state by comparing the duration with the upper and lower limit values at an end time of the event data.

* * * * *